(12) United States Patent
Lin et al.

(10) Patent No.: US 12,218,196 B2
(45) Date of Patent: Feb. 4, 2025

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Yu-Chang Lin, Hsinchu (TW); Chun-Hung Wu, New Taipei (TW); Liang-Yin Chen, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 405 days.

(21) Appl. No.: 17/670,924

(22) Filed: Feb. 14, 2022

(65) Prior Publication Data

US 2023/0261048 A1   Aug. 17, 2023

(51) Int. Cl.
*H01L 29/06* (2006.01)
*H01L 21/8234* (2006.01)
(Continued)

(52) U.S. Cl.
CPC .. *H01L 29/0665* (2013.01); *H01L 21/823412* (2013.01); *H01L 21/823418* (2013.01); *H01L 21/823468* (2013.01); *H01L 29/42392* (2013.01); *H01L 29/66545* (2013.01); *H01L 29/66742* (2013.01); *H01L 29/78618* (2013.01); *H01L 29/78696* (2013.01)

(58) Field of Classification Search
CPC ......... H01L 29/0665; H01L 21/823412; H01L 21/823418; H01L 21/823468; H01L 29/42392; H01L 29/66545; H01L 29/66742; H01L 29/78618; H01L 29/78696; H01L 29/0673; H01L 29/0847; H01L 29/66439; H01L 29/775; H01L 21/823814; H01L 27/092; H01L 29/165; H01L 29/6656; H01L 29/7848; H01L 29/78; H01L 29/66477; B82Y 10/00
See application file for complete search history.

(56) References Cited

U.S. PATENT DOCUMENTS 9,209,247 B2   12/2015   Colinge et al.
9,236,267 B2   1/2016    De et al.
(Continued)

*Primary Examiner* — Douglas W Owens
(74) *Attorney, Agent, or Firm* — Slater Matsil, LLP

(57) ABSTRACT

A method includes depositing a multi-layer stack on a semiconductor substrate, the multi-layer stack including a plurality of sacrificial layers that alternate with a plurality of channel layers; forming a dummy gate on the multi-layer stack; forming a first spacer on a sidewall of the dummy gate; performing a first implantation process to form a first doped region, the first implantation process having a first implant energy and a first implant dose; performing a second implantation process to form a second doped region, where the first doped region and the second doped region are in a portion of the channel layers uncovered by the first spacer and the dummy gate, the second implantation process having a second implant energy and a second implant dose, where the second implant energy is greater than the first implant energy, and where the first implant dose is different from the second implant dose.

20 Claims, 42 Drawing Sheets

(51) Int. Cl.
   *H01L 29/423*   (2006.01)
   *H01L 29/66*    (2006.01)
   *H01L 29/786*   (2006.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 11,348,835 B2 * | 5/2022 | Lin .................. H01L 29/42392 |
| 11,901,235 B2 * | 2/2024 | Lin ................. H01L 21/823807 |
| 2022/0037465 A1 * | 2/2022 | Lin ...................... H01L 29/775 |
| 2022/0319930 A1 * | 10/2022 | Lin ................... H01L 29/42392 |
| 2022/0359653 A1 * | 11/2022 | Liu ................. H01L 21/823412 |
| 2022/0406774 A1 * | 12/2022 | Lin ................... H01L 21/26513 |
| 2023/0042196 A1 * | 2/2023 | Lin ..................... H01L 29/0665 |
| 2024/0120314 A1 * | 4/2024 | Chang ................. H01L 23/5286 |

* cited by examiner

SEMICONDUCTOR DEVICE AND METHOD OF MANUFACTURE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
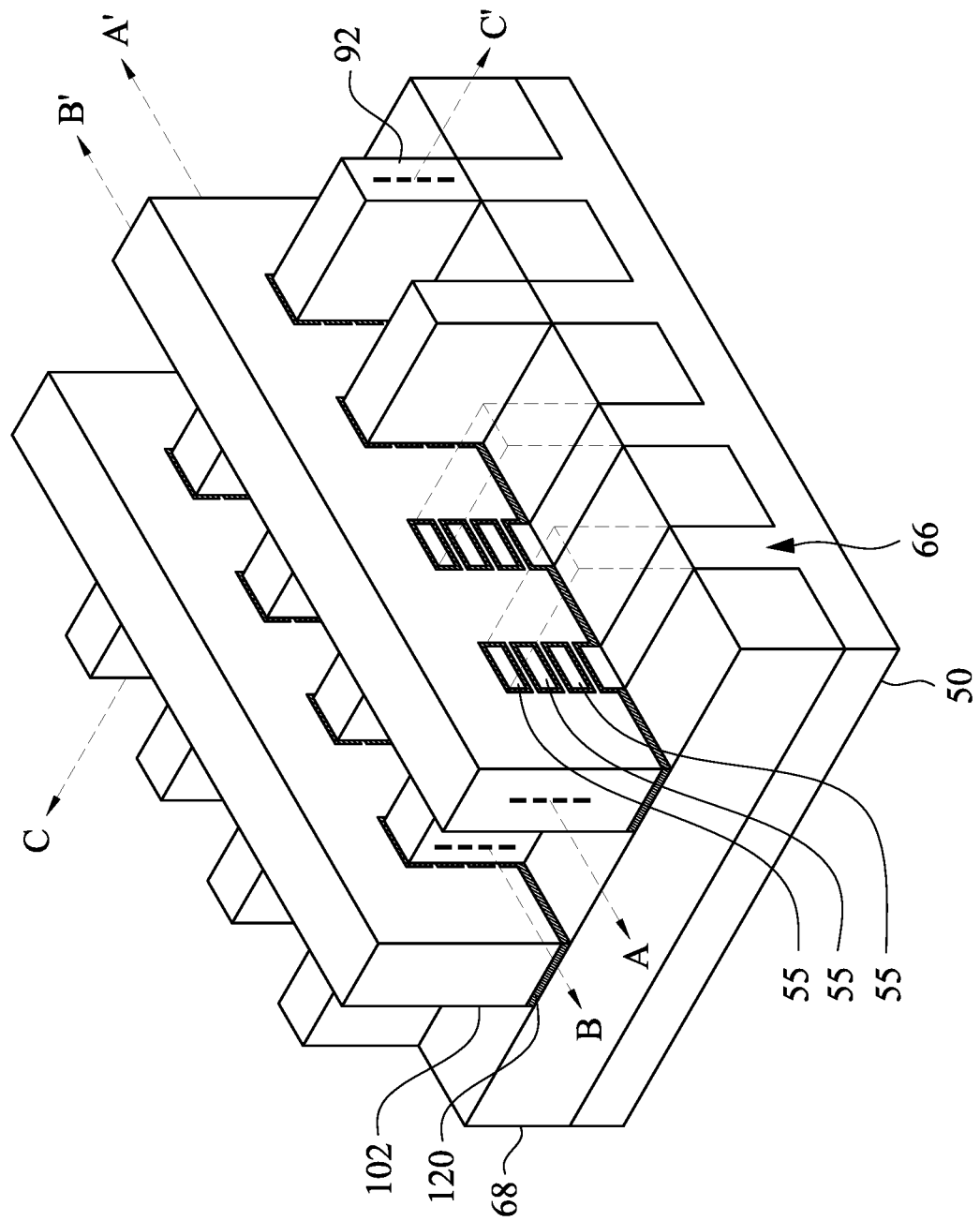
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide semiconductor devices having improved performance and methods of forming the same. The semiconductor devices may be nanostructure field-effect transistors (nano-FETs, also referred to as nanosheet field-effect transistors (NSFETs), nanowire field-effect transistors (NWFETs), or gate-all-around field-effect transistors (GAAFETs)). These embodiments include methods applied to forming semiconductor nanostructures over a semiconductor fin, and forming a dummy gate and a mask over the semiconductor nanostructures and the fin. First spacers are then formed on sidewalls of the dummy gate and the mask. A plurality of ion implantation processes is then performed on the semiconductor nanostructures using modulated ion beams with different implant energies and doses. Second spacers are then formed along sidewalls of the first spacers. A recess is formed in the semiconductor nanostructures and the semiconductor fin. Subsequently, an undoped silicon layer is formed in the recess and an ion implantation process is performed on the silicon layer such that the silicon layer has a gradient-doped profile. A source/drain region is then formed in the recess over the gradient-doped silicon layer.

Advantageous features of one or more embodiments disclosed herein may include the ability to control the lateral straggle of dopants at different depths into the channel regions of the semiconductor structures, as well as allowing for increased lateral straggle into the channel regions under the first spacers, the second spacers, and the dummy gate. This allows for the straggled dopants to extend further into the channel regions of the semiconductor structures and results in shortened effective channel lengths, thereby reducing channel resistance ($R_{ch}$). In addition, the formation of the silicon layer with the gradient-doped profile under the source/drain region results in a reduced electric field under the source/drain region and consequently results in lower junction leakage current ($I_{boff}$). Further, the disclosed method may be integrated easily into existing processes and provides a solution to reduce junction leakage current and channel resistance with lower manufacturing costs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring STI regions 68.

Gate dielectric layers 120 are over top surfaces of the fins 66 and along top surfaces, sidewalls, and bottom surfaces of the nanostructures 55. Gate electrodes 102 are over the gate dielectric layers 120. Epitaxial source/drain regions 92 are disposed on the fins 66 on opposing sides of the gate dielectric layers 120 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is parallel to cross-section A-A' and extends through epitaxial source/drain regions 92 of multiple nano-FETs. Cross-section C-C' is perpendicular to cross-section A-A' and is parallel to a longitudinal axis of a fin 66 of the nano-FET and in a direction of, for example, a current flow between the epitaxial source/drain regions 92 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 8A and FIGS. 9A through 24B are cross-sectional views of intermediate stages in the manufacturing of nano-FETs, in accordance with some embodiments. FIGS. 2 through 5, 6A, 7A, 10A, 11A, 12A, 14A, 16A, 17A, 18A, 19A, 20A, 21A, 22A, 23A, and 24A illustrate reference cross-section A-A' illustrated in FIG. 1. FIGS. 6B, 7B, 10B, 11B, 14B, 16B, and 16C illustrate reference cross-section B-B' illustrated in FIG. 1. FIGS. 6C, 7C, 8A, 9A, 9B, 9C, 9D, 9E, 9F, 9G, 9H, 9I, 9J, 9K, 9L, 9M, 9N, 9O, 9P, 9Q, 9R, 9S, 9T 10C, 11C, 12, 13, 14C, 15, 16D, 16E, 16F, 16G, 16H, 16I, 16J, 16K, 16L, 16M, 16N, 16O, 16P, 16Q, 16R, 16S, 16T, 16U, 16V, 17B, 18B, 19B, 20B, 20C, 21B, 22B, 23B, and 24B illustrate reference cross-section C-C' illustrated in FIG. 1.

Figure 2:
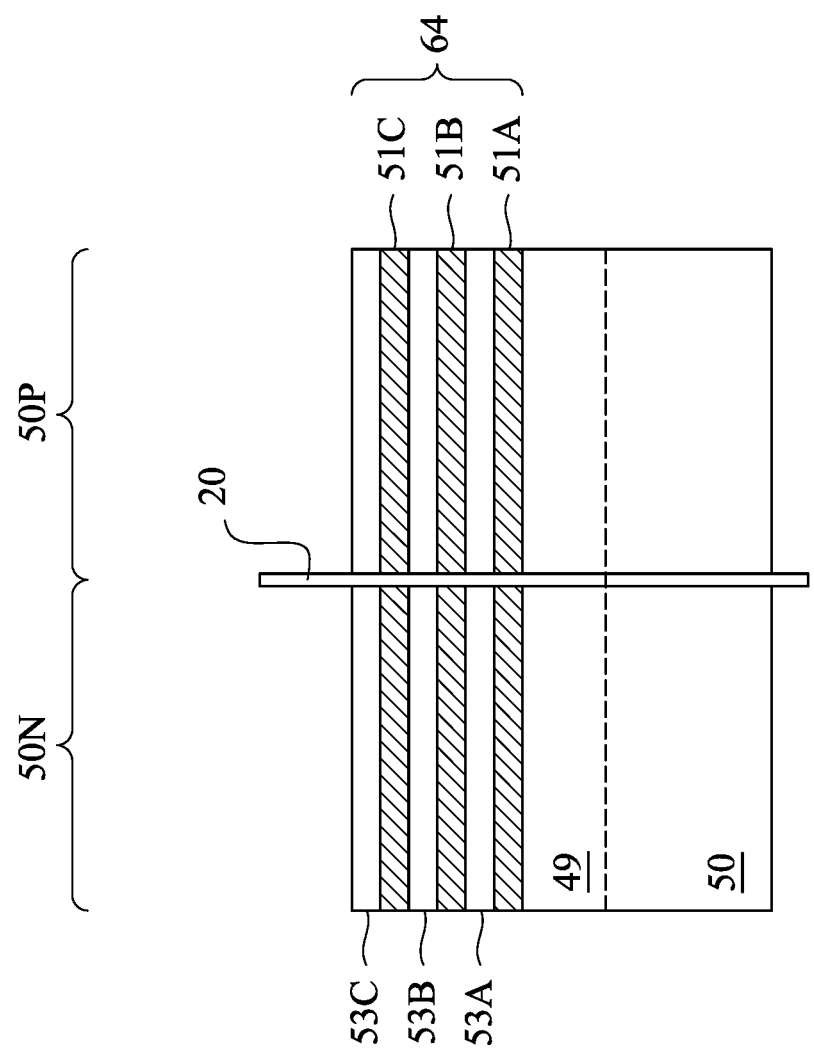
FIGS. 2, 3, 4, 5, 6A, 6B, 6C, 7A, 7B, and 7C are cross-sectional views of intermediate stages in the manufacturing of nano-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region 49. During the APT implantation, dopants may be implanted in the n-type region 50N and the p-type region 50P. The dopants may have a conductivity type opposite a conductivity type of source/drain regions to be formed in each of the n-type region 50N and the p-type region 50P. The APT region 49 may extend under subsequently formed source/drain regions in the resulting nano-FETs, which will be formed in subsequent processes. In some embodiments, the doping concentration in APT region 49 may be from about $1\times10^{18}$ atoms/cm$^3$ to about $1\times10^{19}$ atoms/cm$^3$. For simplicity and legibility, the APT region 49 may not be illustrated in each of the subsequent drawings.

Further in FIG. 2, a multi-layer stack 64 is formed over the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). For purposes of illustration and as discussed in greater detail below, the first semiconductor layers (which may also referred to as sacrificial layers) 51A, 51B and 51C will be removed and the second semiconductor layers (which may also referred to as channel layers) 53A, 53B and 53C will be patterned to form channel regions of nano-FETs in the n-type region 50N and the p-type region 50P. However, in some embodiments the first semiconductor layers 51A, 51B and 51C may be removed and the second semiconductor layers 53A, 53B and 53C may be patterned to form channel regions of nano-FETs in the n-type region 50N, and the second semiconductor layers 53A, 53B and 53C may be removed and the first semiconductor layers 51A, 51B and 51C may be patterned to form channel regions of nano-FETs in the p-type region 50P. In some embodiments the second semiconductor layers 53A, 53B and 53C may be removed and the first semiconductor layers 51A, 51B and 51C may be patterned to form channel regions of nano-FETs in the n-type region 50N, and the first semiconductor layers 51A, 51B and 51C may be removed and the second semiconductor layers 53A, 53B and 53C may be patterned to form channel regions of nano-FETs in the p-type region 50P. In some embodiments, the second semiconductor layers 53A, 53B and 53C may be removed and the first semiconductor layers 51A, 51B and 51C may be patterned to form channel regions of nano-FETs in both the n-type region 50N and the p-type region 50P.

The multi-layer stack 64 is illustrated as including three layers of the first semiconductor layers 51 and three layers of the second semiconductor layers 53 for illustrative purposes. In some embodiments, the multi-layer stack 64 may include two or more of the first semiconductor layers 51 and two or more of the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53A, 53B and 53C to be patterned to form channel regions of nano-FETs. Similarly, in embodiments in which the second semiconductor layers 53 are removed and the first semiconductor layers 51A, 51B and 51C are patterned to form channel regions, the second semiconductor layers 53 of the second semiconductor material may be removed without significantly removing the first semiconductor layers 51 of the first semiconductor material, thereby allowing the first semiconductor layers 51A, 51B and 51C to be patterned to form channel regions of nano-FETs.

Figure 3:
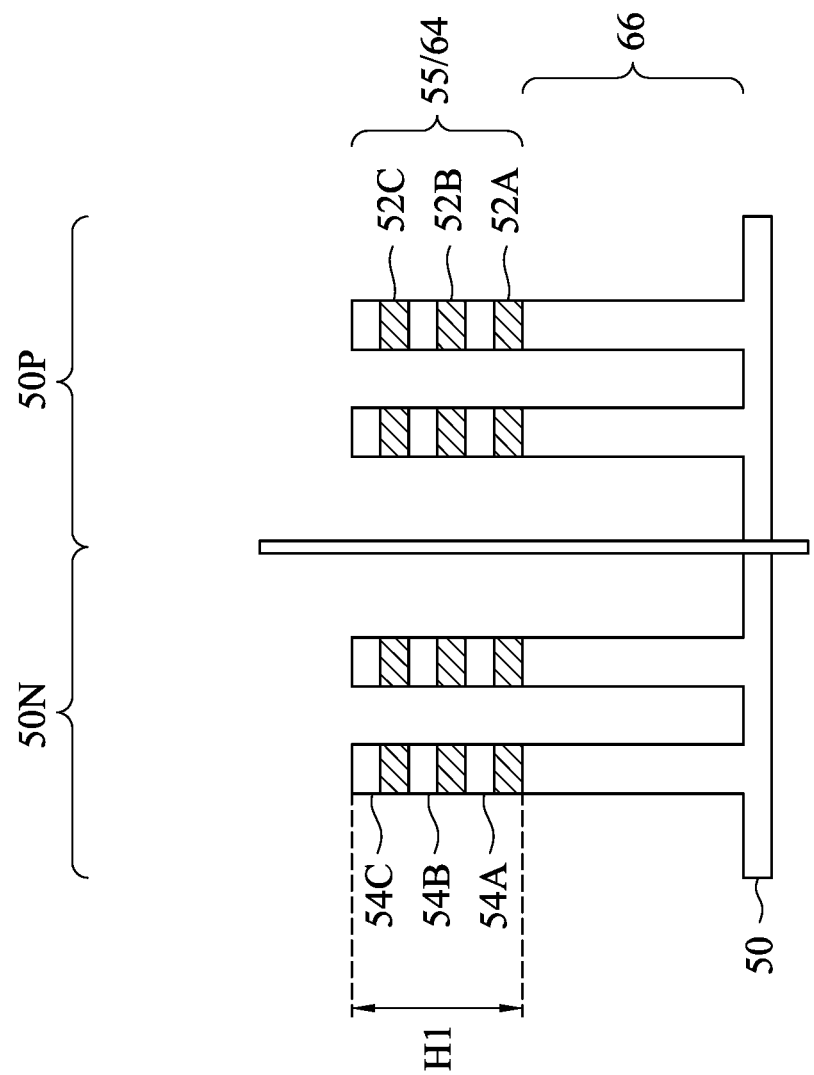

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nanostructures 54A-54C (collectively referred to as the second nanostructures 54) from the second semiconductor layers 53. The first nanostructures 52 and the second nanostructures 54 may be collectively referred to as nanostructures 55. In an embodiment, a height H1 from a topmost surface of the nanostructures 55 (for example, a top surface of second nanostructure 54C) to a bottommost surface of the nanostructures 55 (for example, a bottom surface of first nanostructure 52A) may be in a range from 40 nm to 60 nm.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
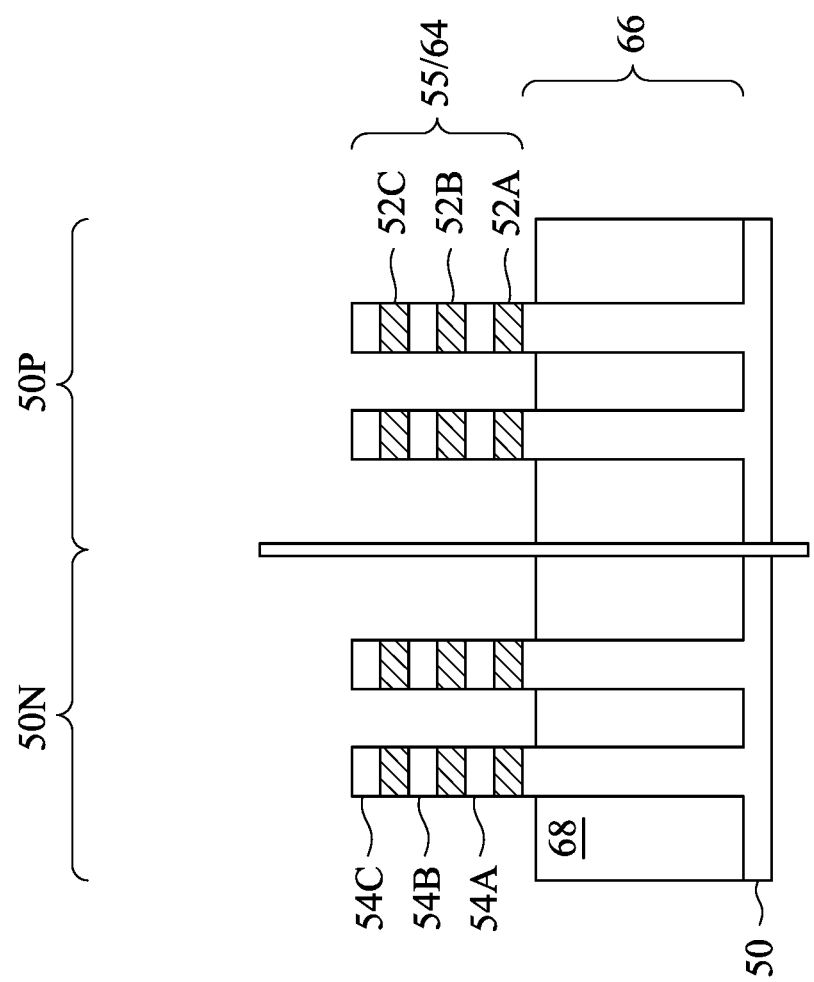

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
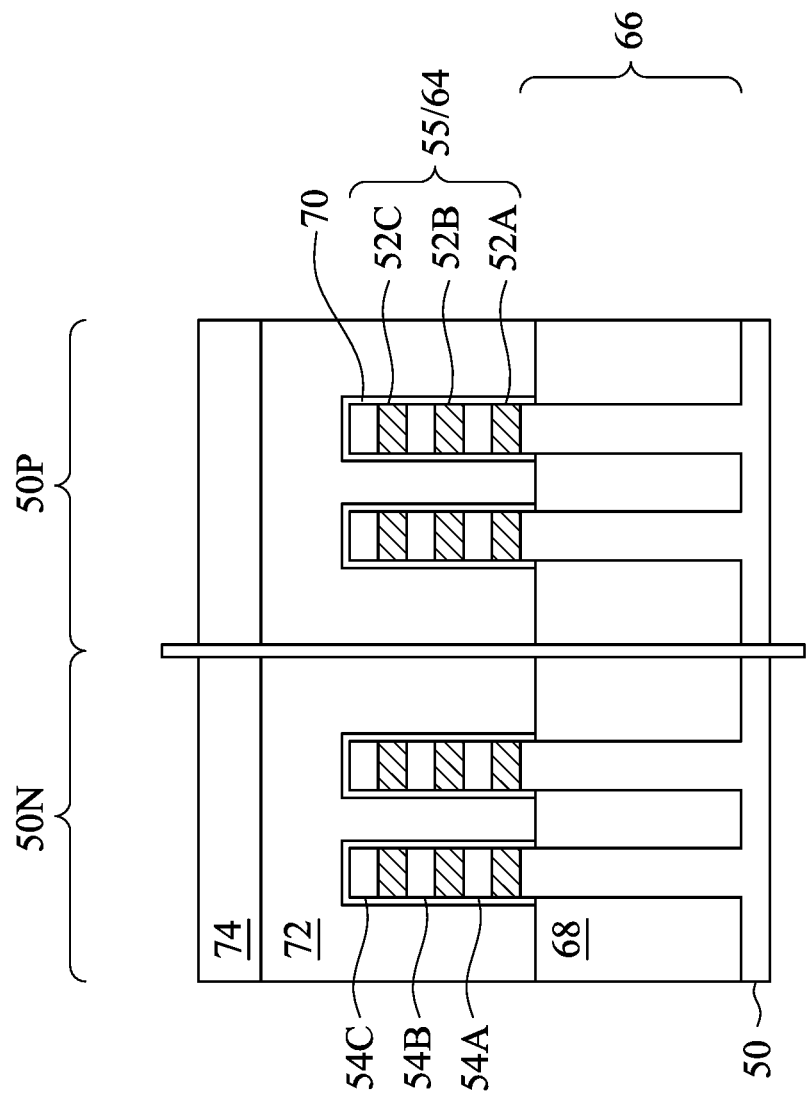

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6B:
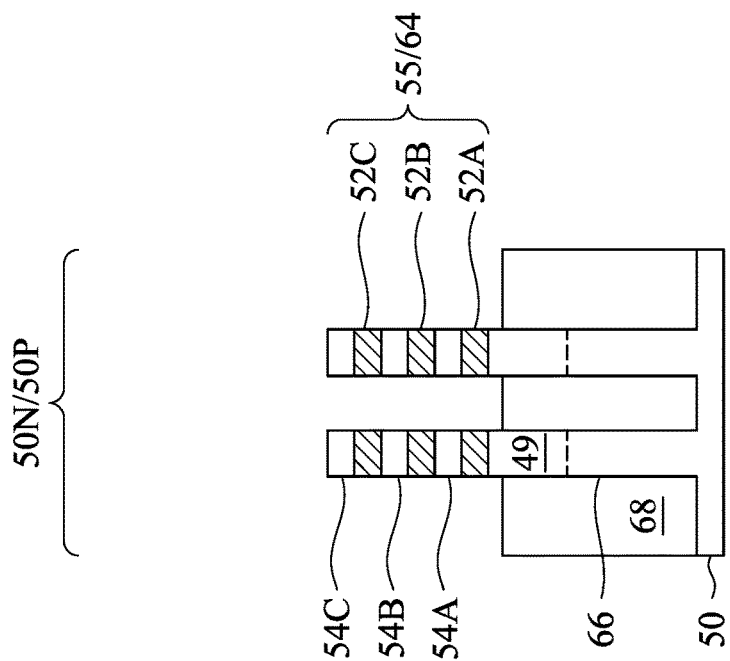
Figure 6A:
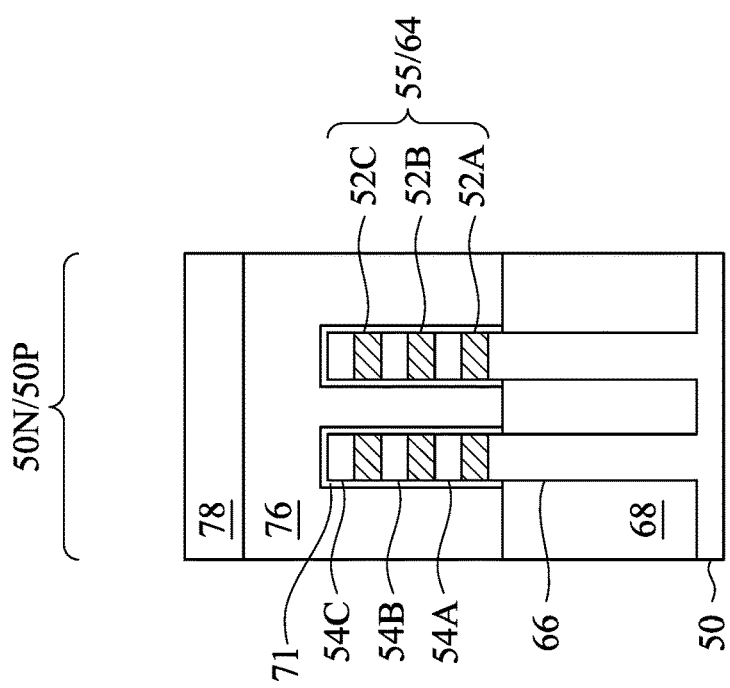
Figure 6C:
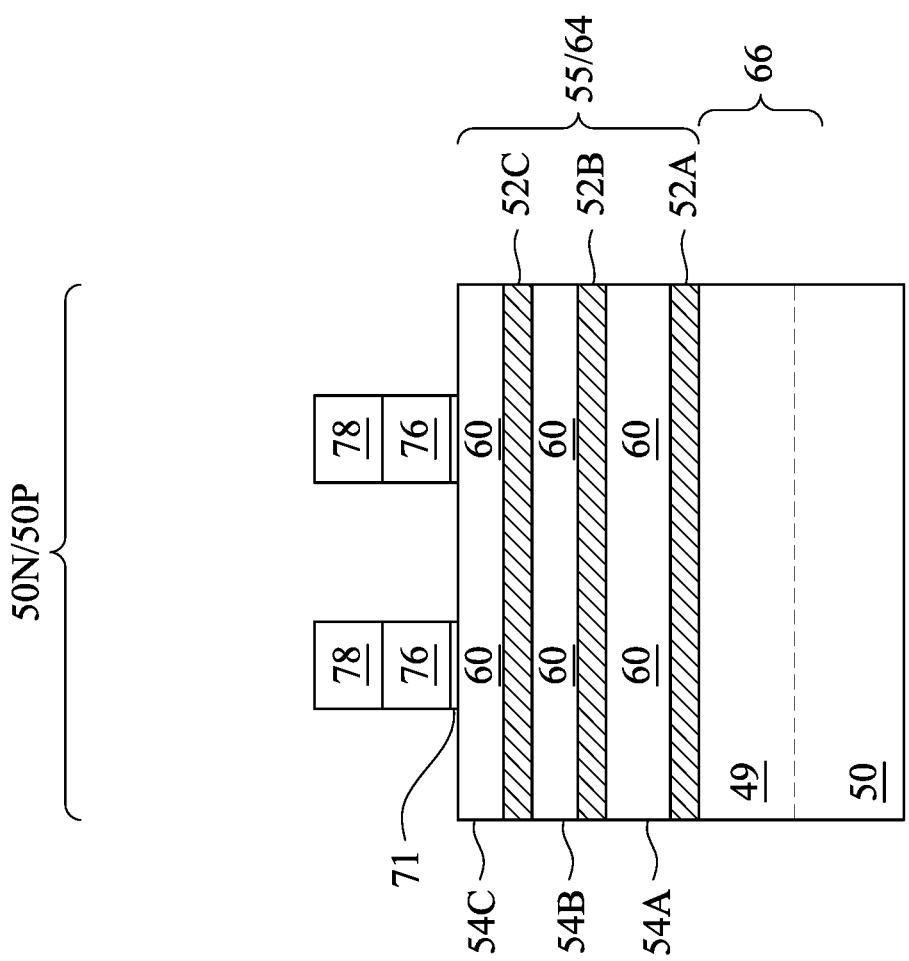

FIGS. 6A through 24B illustrate various additional steps in the manufacturing of embodiment devices. FIGS. 6A through 24B illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions 60 of the fins 66 and/or the nanostructures 55. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7B:
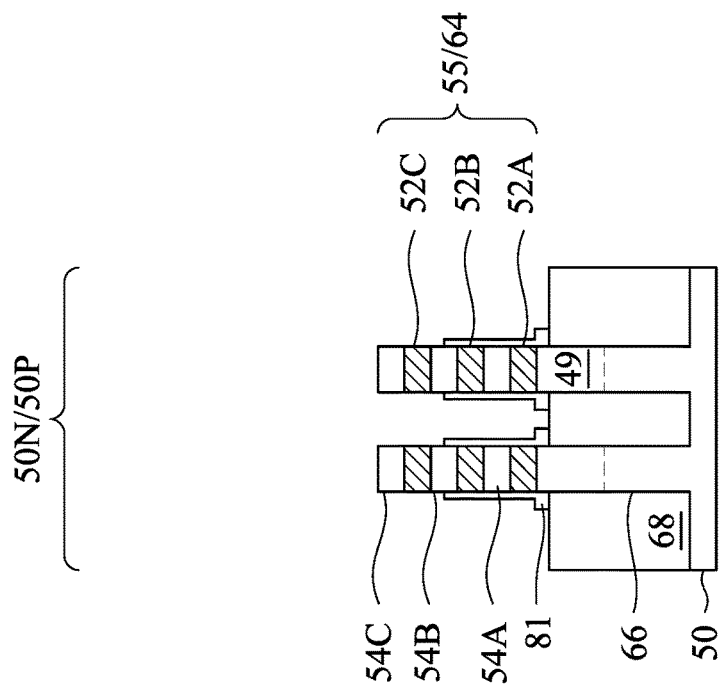
Figure 7A:
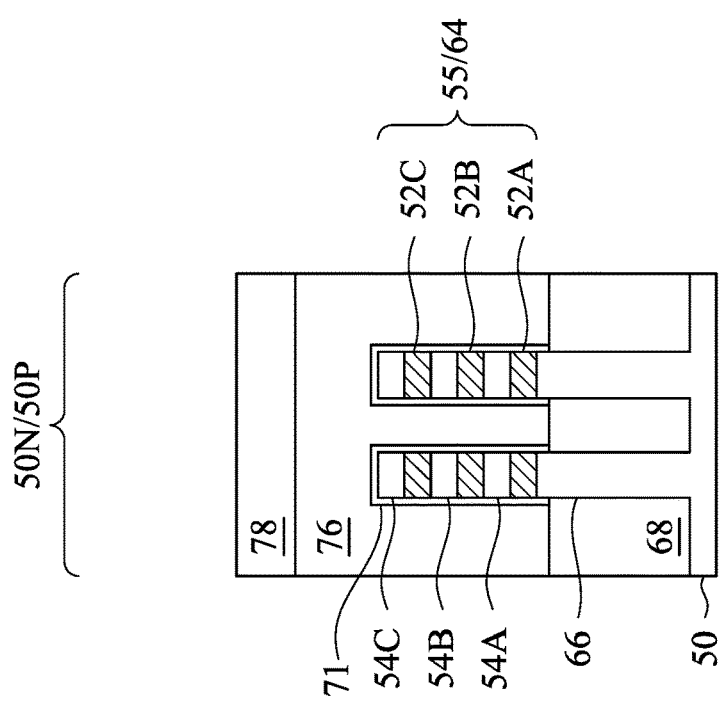
Figure 7C:
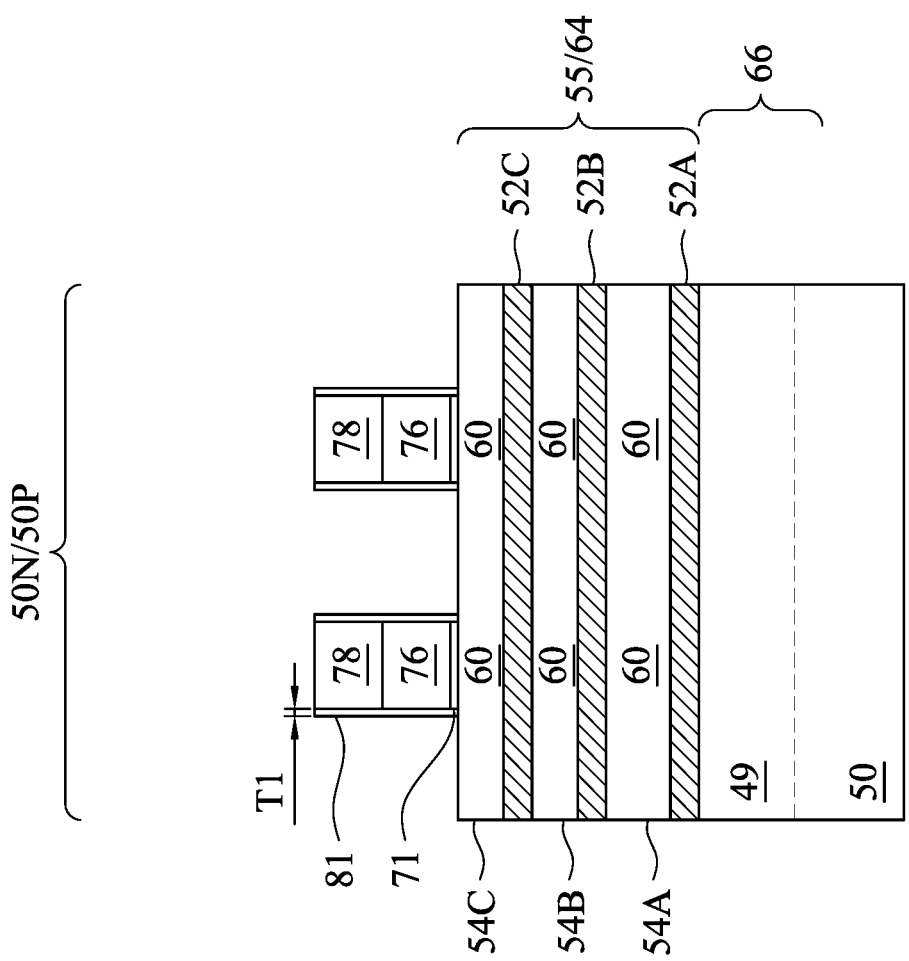

In FIGS. 7A through 7C, first spacers 81 are formed by depositing a first spacer layer over the structures illustrated in FIGS. 6A through 6C, and then subsequently patterning the first spacer layer. The first spacer layer is formed on top surfaces of the STI regions 68; top surfaces and sidewalls of the fins 66, the nanostructures 55, and the masks 78; and sidewalls of the dummy gates 76 and the dummy gate dielectric 71 and may be formed of silicon oxide, silicon nitride, silicon oxynitride, or the like, using techniques such as thermal oxidation or deposited by CVD, ALD, or the like. The first spacer layer is then etched to form first spacers 81. As will be discussed in greater detail below, the first spacers 81 and the second spacers 82 (shown subsequently in FIGS. 10A through 10C) act to self-aligned subsequently formed source drain regions, as well as to protect sidewalls of the fins 66 and/or nanostructure 55 during subsequent processing. The first spacer layer may be etched using a suitable etching process, such as an isotropic etching process (e.g., a wet etching process), an anisotropic etching process (e.g., a dry etching process), or the like. In an embodiment, the first spacers 81 may have a thickness T1 in a range from 3 nm to 5 nm.

Figure 8A:
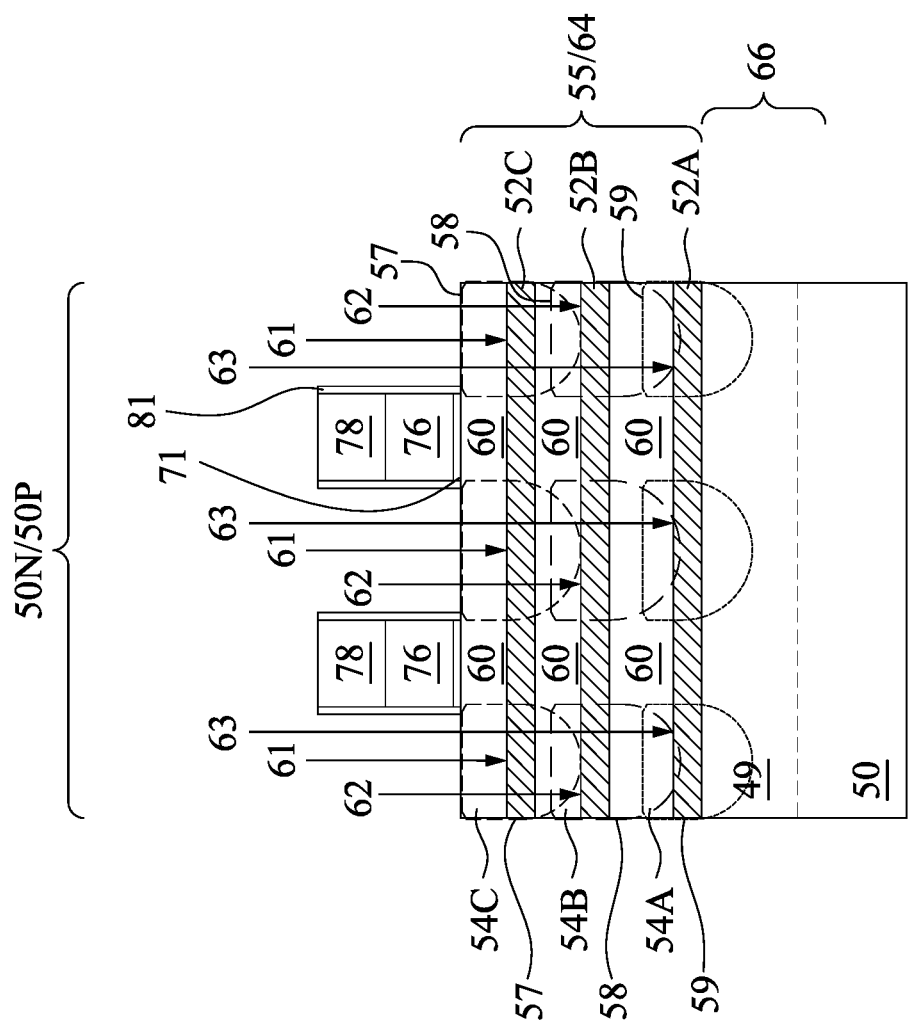
FIGS. 8A-8C illustrate implantation processes 61-63 used to direct an implantation species or dopants.
Figure 8C:
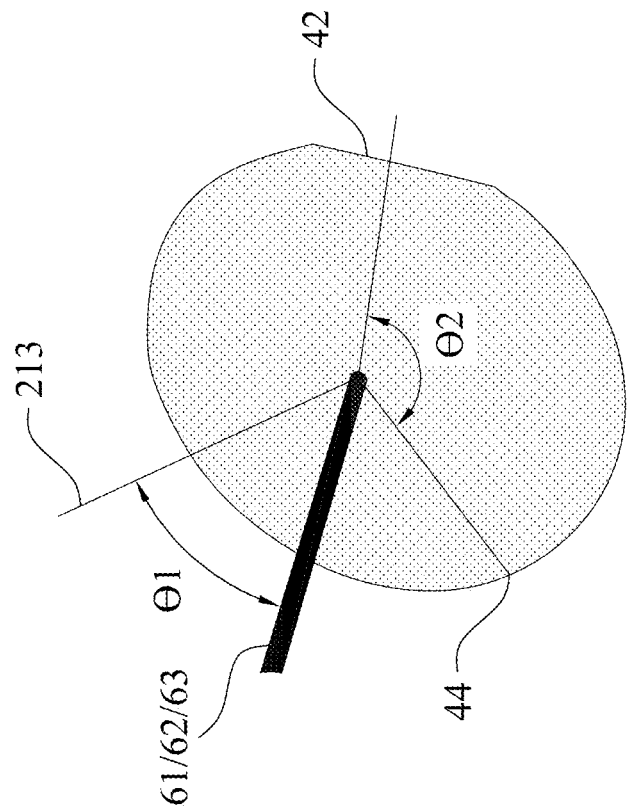
Figure 8B:
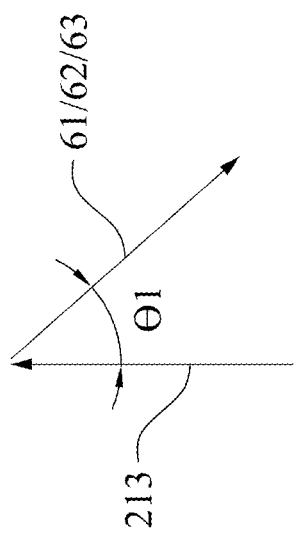

In FIG. 8A, a plurality of implantation processes 61-63 are performed on the nanostructures 55 and/or fins 66 to introduce dopants into exposed areas of the nanostructures 55 and/or fins 66 (e.g., areas not covered by the first spacers 81, the dummy gates 76 and the masks 78). In some embodiments, the first spacers 81, the dummy gates 76 and the masks 78 are used as implantation masks during the implantation processes 61-63. The plurality of implantation processes 61-63 are used to introduce dopants into the nanostructures 55 and/or fins 66 at different depths and may be performed using a high current ion implanter, or the like. As shown in FIG. 8B, the implantation processes 61-63 may direct an implantation species (or dopants) at a tilt angle θ1 with respect to the axis 213, which is perpendicular to the major surface of the substrate 50 (e.g., a wafer). In some embodiments, the tilt angle θ1 may be in a range from 0° to 30°. As shown in FIG. 8C, the implantation processes 61-63 may direct an implantation species at a twist (also referred to as a rotation) angle θ2 that specifies the angle between a wafer notch or flat 42 (for example, when the substrate 50 is the wafer) and the vector 44 formed by the projection of the ion beam direction vector on to the wafer. In some embodiments, the twist/rotation angle θ2 may be in a range from 0° to 360°.

The implantation processes 61-63 may be performed such that an implantation species (dopant) is delivered in each of the implantation processes 61-63 using an ion beam having different implant energies and having different implant doses. Each of the implantation processes 61-63 may introduce dopants into the nanostructures 55 and/or fins 66 at selected depths. For example, in an embodiment, the implantation process 61 may introduce dopants into the second nanostructures 54B/54C and the first nanostructure 52C using a first implant energy to form a doped region 57. In an embodiment, the implantation process 62 may introduce dopants into the second nanostructures 54A/54B and the first nanostructure 52B using a second implant energy to form a doped region 58. The doped region 58 is lower than the doped region 57. In an embodiment, the implantation process 63 may introduce dopants into the second nano structure 54A, the first nanostructure 52A, and the fin 66 using a third implant energy to form a doped region 59. The doped region 59 is lower than the doped region 58. In an embodiment, the third implant energy is greater than the first implant energy and the second implant energy, and the second implant energy of the implantation process 62 is greater than the first implant energy of the implantation process 61. In such a way, an implantation process with greater implant energy allows dopants to be introduced into the nanostructures 55 and/or fins 66 at a greater depth. The implantation processes 61-63 may be performed in any order, and may be performed to introduce dopants at different depths of the nanostructures 55 and/or fins 66 as those shown in FIG. 8A. Although three implantation processes 61-63 are shown in FIG. 8A, two or more implantation processes may be performed on the nanostructures 55 and/or fins 66. Although FIG. 8A shows the doped regions 57, 58 and 59 overlapping with each other, in some embodiments none of the doped regions 57, 58 and 59 overlap with each other. In an embodiment, each of the doped regions 57, 58 and 59 may have a gradient-doped profile such that a dopant concentration decreases from a topmost point of each of the doped regions 57, 58 and 59 in a direction towards the substrate 50. In an embodiment, the implant energies and implant doses (explained subsequently in FIG. 9B) can be tuned so that the doped regions 57, 58, and 59 (including overlapping portions of the doped regions 57, 58, and 59) have substantially uniform dopant concentration.

The implantation species may include ions formed from, arsenic (As), phosphorous (P), antimony (Sb), boron di-fluoride ($BF_2$), boron (B), combinations thereof, or the like. In an embodiment, the implantation processes 61-63 introduce dopants derived from arsenic (As) and/or phosphorous (P) into the nanostructures 55 and/or fins 66 in the n-type region 50N, e.g., the NMOS region. In an embodiment, the implantation processes 61-63 introduce dopants derived from antimony (Sb), boron di-fluoride ($BF_2$) and/or boron (B) into the nanostructures 55 and/or fins 66 in the p-type region 50P, e.g., the PMOS region. In this way, the nano-structures 55 and/or fins 66 in the n-type region 50N, e.g., the NMOS region and/or the nanostructures 55 and/or fins 66 in the p-type region 50P, e.g., the PMOS region may be doped with arsenic (As), phosphorous (P), antimony (Sb), boron di-fluoride ($BF_2$), boron (B), combinations thereof, or the like. The implantation species may be delivered using an ion beam such that after the implantation processes 61-63, a dopant concentration of the implanted dopants in the nanostructures 55 and/or fins 66 is in the range from $1 \times 10^{17}$ atoms/cm$^3$ to $1 \times 10^{21}$ atoms/cm$^3$.

In an embodiment, the implantation processes 61-63 may be performed at a temperature that is in a range from −60° C. to 450° C. In an embodiment, when the implantation species includes ions formed from arsenic (As), the implantation species may be delivered using an ion beam having an energy that is in a range from 3 keV to 60 keV. In an embodiment, when the implantation species includes ions formed from phosphorous (P), the implantation species may be delivered using an ion beam having an energy that is in a range from 2 keV to 35 keV. In an embodiment, when the implantation species includes ions formed from antimony (Sb), the implantation species may be delivered using an ion beam having an energy that is in a range from 8 keV to 80 keV. In an embodiment, when the implantation species includes ions formed from boron di-fluoride ($BF_2$), the implantation species may be delivered using an ion beam having an energy that is in a range from 3 keV to 46 keV. In an embodiment, when the implantation species includes ions formed from boron (B), the implantation species may be delivered using an ion beam having an energy that is in a range from 1 keV to 12 keV. In an embodiment, the implantation species (dopants) may be delivered using an ion beam having a dose that is in a range from $1 \times 10^{14}$ atoms/cm$^2$ to $1 \times 10^{16}$ atoms/cm$^2$.

In an embodiment, after the first spacers 81 are formed and prior to forming second spacers 82 (shown subsequently in FIGS. 10A through 10C), implants for lightly doped source/drain (LDD) regions (not separately illustrated) may also be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities up to about $1\times10^{19}$ atoms/cm$^3$. An anneal may be used to repair implant damage and to activate the implanted impurities.

Figure 9A:
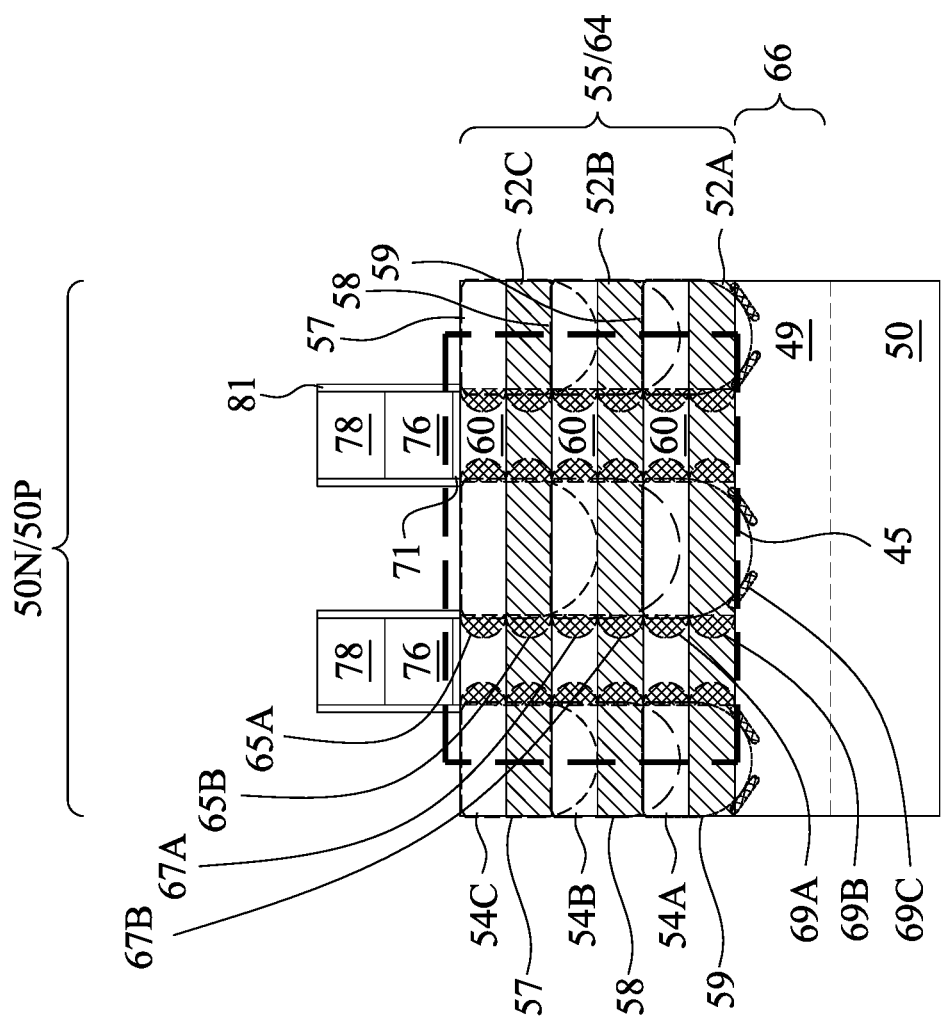
FIGS. 9A, 9B, 9C, 9D, 9E, 9F, 9G, 9H, 9I, 9J, 9K, 9L, 9M, 9N, 9O, 9P, 9Q, 9R, 9S, 9T, 10A, 10B, 10C, 11A, 11B, 11C, 12, 13, 14A, 14B, 14C, 15, 16A, 16B, 16C, 16D, 16E, 16F, 16G, 16H, 16I, 16J, 16K, 16L, 16M, 16N, 16O, 16P, 16Q, 16R, 16S, 16T, 16U, 16V, 17A, 17B, 18A, 18B, 19A, 19B, 20A, 20B, 21A, 21B, 22A, 22B, 23A, 23B, 24A and 24B are cross-sectional views of intermediate stages in the manufacturing of nano-FETs, in accordance with some embodiments.

FIG. 9A illustrates the movement of dopants (also referred to as lateral straggle) parallel to a top surface of the substrate 50 and away from the doped regions 57, 58 and 59 after the implantation processes 61-63 have been performed. After implantation processes 61-63 are performed, lateral straggle (also referred to as migration) of the introduced dopants occurs in the first nanostructures 52A-52C, the second nanostructures 54A-54C, and the fin 66. For example, after the implantation processes 61-63, diffusion of dopants out of the doped regions 57, 58 and 59 occurs, such that lateral straggle occurs in regions 65A, 67A, 69A, and 69C in the second nanostructure 54C, second nanostructure 54B, second nanostructure 54A, and the fin 66, respectively. Lateral straggle may also occur in regions 65B, 67B, and 69B in the first nanostructure 52C, first nanostructure 52B, and first nanostructure 52A, respectively. The regions 65A are therefore formed on ends of the channel region 60 of the second nanostructure 54C (also referred to as channel layer 54C). The regions 65A may be adjacent to the doped regions 57. The regions 67A are formed on ends of the channel region 60 of the second nanostructure 54B (also referred to as channel layer 54B). The regions 67A may be adjacent to the doped regions 58. The regions 69A are formed on ends of the channel region 60 of the second nanostructure 54A (also referred to as channel layer 54A). The regions 69A may be adjacent to the doped regions 59.

Figure 9B:
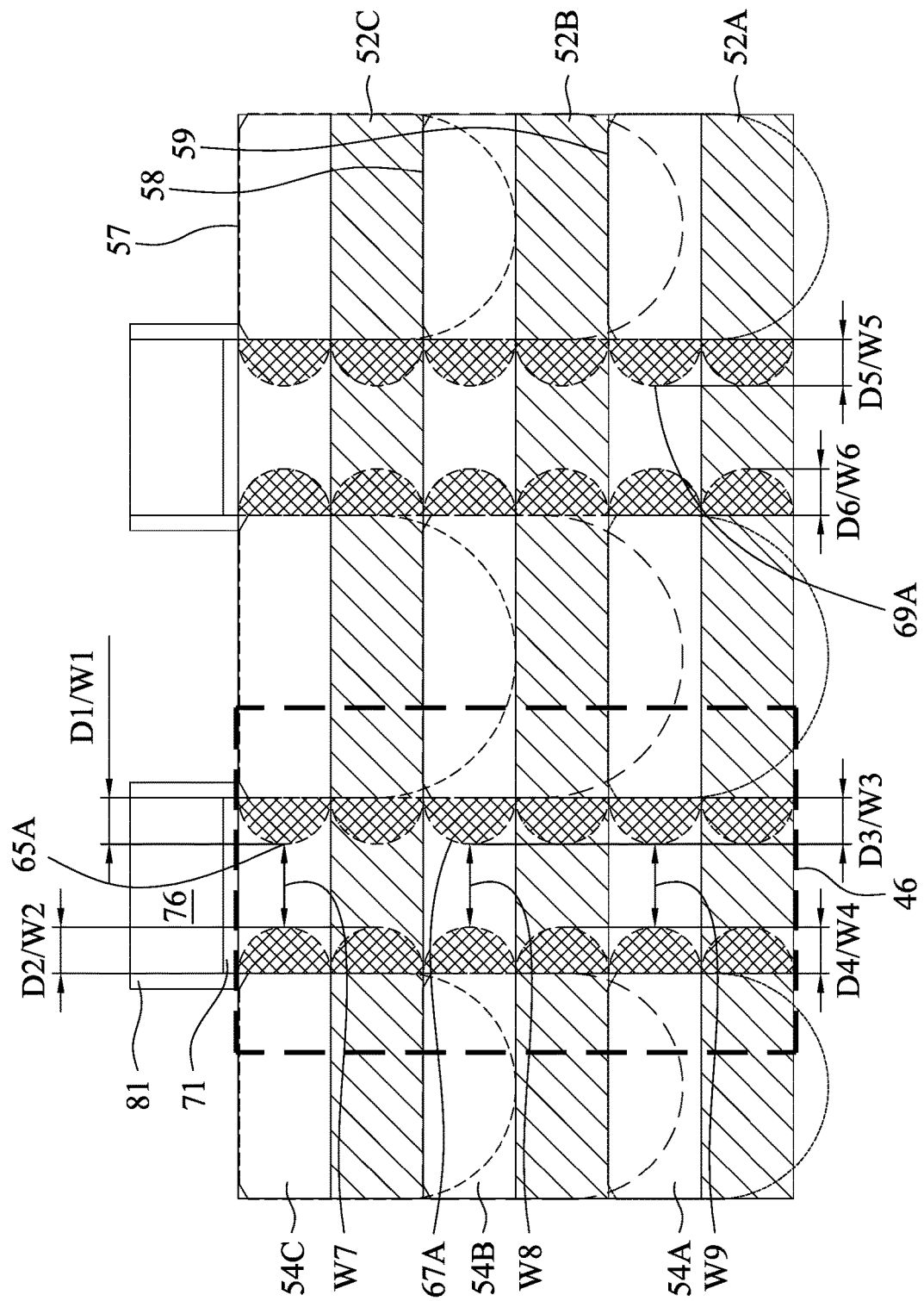

FIG. 9B illustrates a detailed view of region 45 of FIG. 9A. FIG. 9B shows the lateral straggle in the regions 65A, 67A, and 69A of the second nanostructures 54C, 54B and 54A, respectively that were shown previously in FIG. 9A. FIG. 9B also illustrates the lateral straggle in the regions 65B, 67B, and 69B of the first nano structures 52C, 52B, and 52A, respectively that were shown previously in FIG. 9A. The regions 65B, 67B, and 69B may not be labeled in subsequent figures. The lateral straggle in the regions 65A and 65B may extend under the first spacers 81, the masks 78, and the dummy gates 76 by distances D1 and D2, respectively, such that each of the regions 65A has a first width W1, and each of the regions 65B has a second width W2. The lateral straggle in the regions 67A and 67B may extend under the first spacers 81, the masks 78, and the dummy gates 76 by distances D3 and D4, respectively, such that each of the regions 67A has a third width W3, and each of the regions 67B has a fourth width W4. The lateral straggle in the regions 69A and 69B may extend under the first spacers 81, the masks 78 and the dummy gates 76 by distances D5 and D6, respectively, such that each of the regions 69A has a fifth width W5, and each of the regions 69B has a sixth width W6. In an embodiment, a portion of the second nanostructure 54C in between the regions 65A, and under a dummy gate 76 may have a seventh width W7. In an embodiment, a portion of the second nanostructure 54B in between the regions 67A, and under a dummy gate 76 may have an eighth width W8. In an embodiment, a portion of the second nanostructure 54A in between the regions 69A, and under a dummy gate 76 may have a ninth width W9. The amount of lateral straggle and consequently the distances D1 and D2 of the regions 65A and 65B are dependent on the implant dose used during the implantation process 61. The amount of lateral straggle and consequently the distances D3 and D4 of the regions 67A and 67B are dependent on the implant dose used during the implantation process 63. The amount of lateral straggle and consequently the distances D5 and D6 of the regions 67A and 67B are dependent on the implant dose used during the implantation process 63. The greater the implant dose used in the each of the implantation processes 61-63, the greater the lateral straggle intensity, which results in a greater corresponding distance D1-D6. In an embodiment, the implant dose used during each of the implantation processes 61-63 may be in a range from $1\times10^{14}$ atoms/cm$^2$ to $1\times10^{16}$ atoms/cm$^2$.

Still referring to FIG. 9B, the distance D1 of the region 65A, the distance D3 of the region 67A, and the distance D5 of the region 69A may be equal (within process variations). Similarly, the distances D2 of the region 62B, the distance D4 of the region 67B and the distance D6 of the region 69B may be equal (within process variations). This may be achieved by performing the implantation process 61 with a first implant dose, the implantation process 62 with a second implant dose and the implantation process 63 with a third implant dose, wherein the first implant dose, the second implant dose and the third implant dose are equal. In an embodiment, one or more of the distances D1-6 may be different from the others of the distances D1-6. In other embodiments, all the distances D1-D6 may be different from each other. In an embodiment in which the first nanostructures 52 and the second nanostructures 54 comprise different materials, distance D1 may be different from distance D2, distance D3 may be different from distance D4, and distance D5 may be different from distance D6, since the rate of lateral straggle may be different in different materials despite an implantation process with a selected implant dose being performed on both the materials. In an embodiment, the regions 65A, 65B, 67A, 67B, 69A, 69B and 69C may have dopant concentrations in a range from $1\times10^{18}$ atoms/cm$^3$ to $1\times10^{20}$ atoms/cm$^3$. Each of the regions 65A, 65B, 67A, 67B, 69A, 69B and 69C may have a gradient-doped profile such that dopant concentrations of the regions 65A and 65B decrease in a direction extending from a center of the doped region 57 to a channel region 60 adjacent the doped region 57. In addition, dopant concentrations of the regions 67A and 67B decrease in a direction extending from a center of the doped region 58 to a channel region 60 adjacent the doped region 58, and dopant concentrations of the regions 69A, 69B and 69C decrease in a direction extending from a center of the doped region 59 to a channel region 60 adjacent the doped region 59.

By using implantation processes 61-63 having different implant energies and implant doses, dopants can be introduced into the nanostructures 55 and/or fins 66 in a controlled manner so as to achieve different dopant and laterally straggled profiles. An implantation process with a greater implant energy allows dopants to be introduced into the nanostructures 55 and/or fins 66 at a greater depth. The greater the implant dose used in the implantation process, the greater the lateral straggle intensity, which results in greater corresponding lateral straggle distances D1-D6.

Figure 9C:
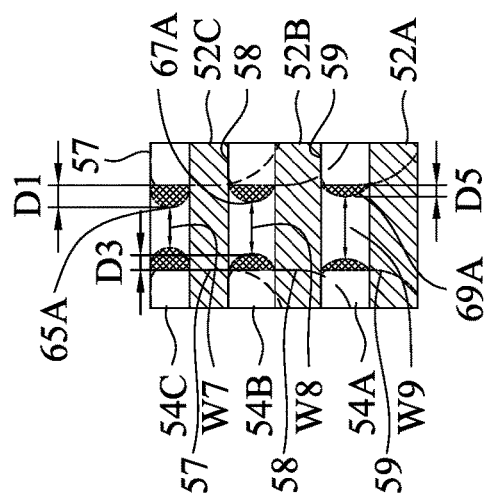
Figure 9D:
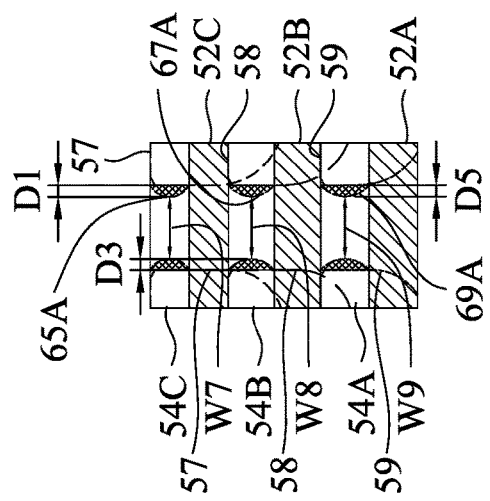
Figure 9E:
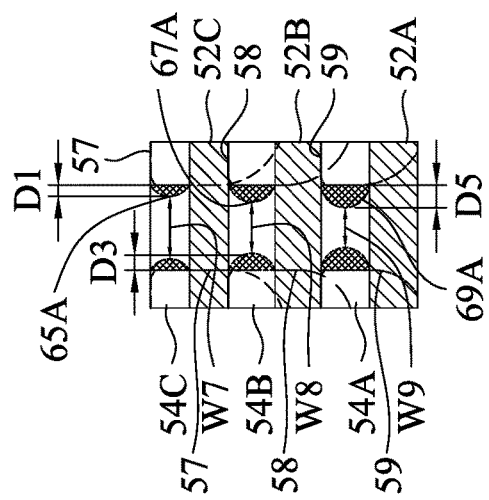
Figure 9F:
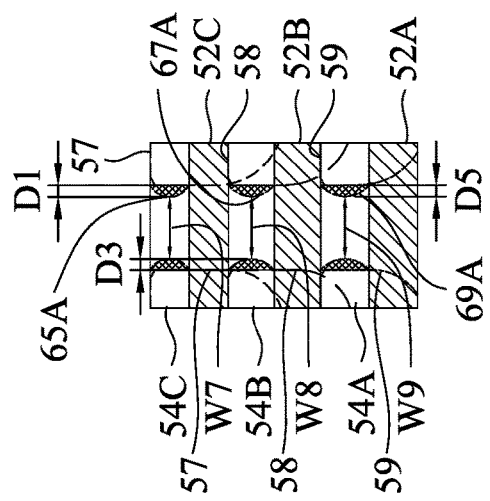
Figure 9G:
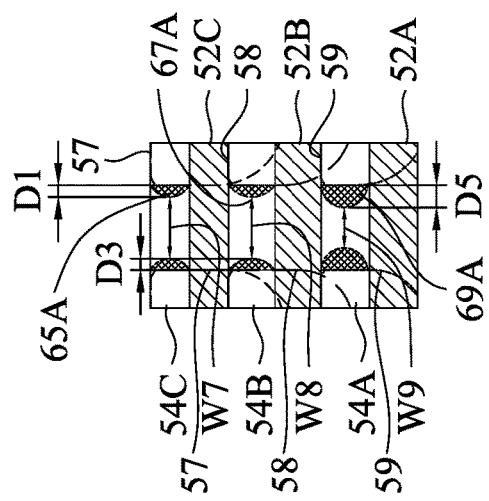
Figure 9H:
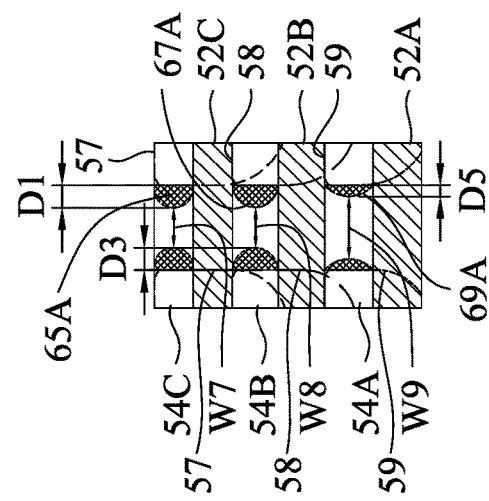
Figure 9I:
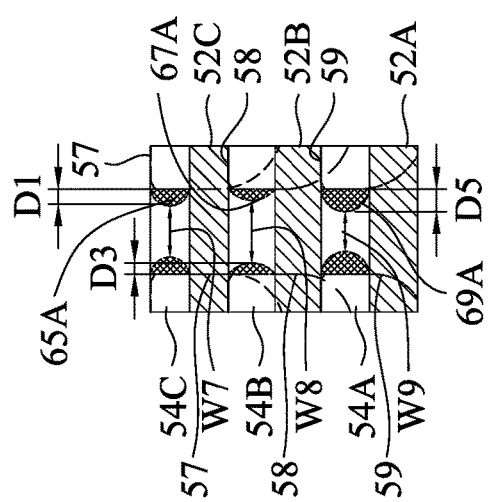
Figure 9J:
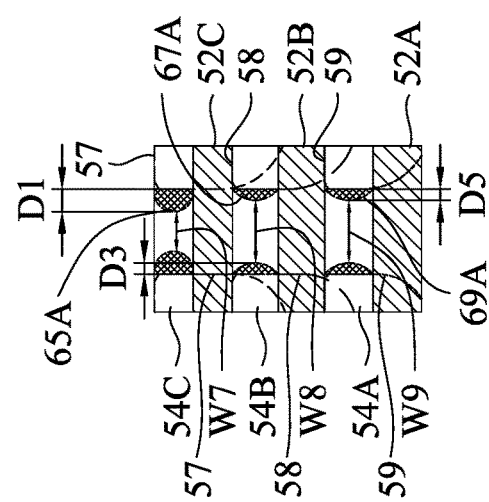
Figure 9K:
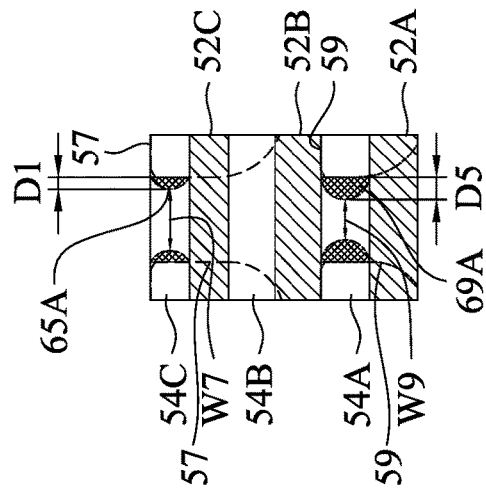
Figure 9L:
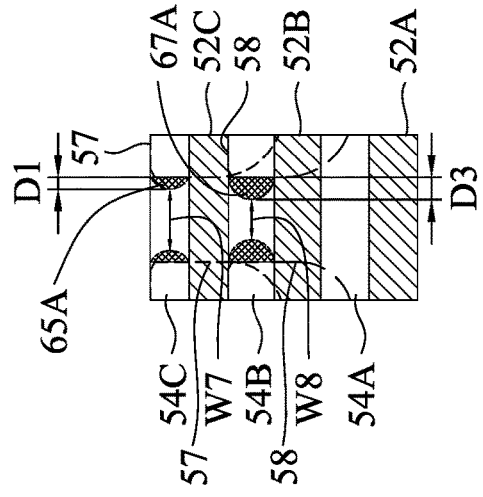
Figure 9M:
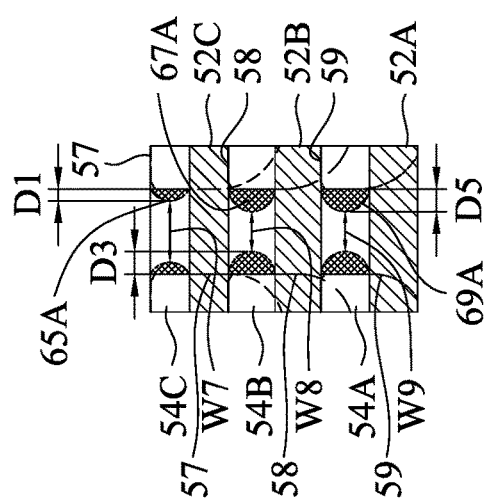
Figure 9N:
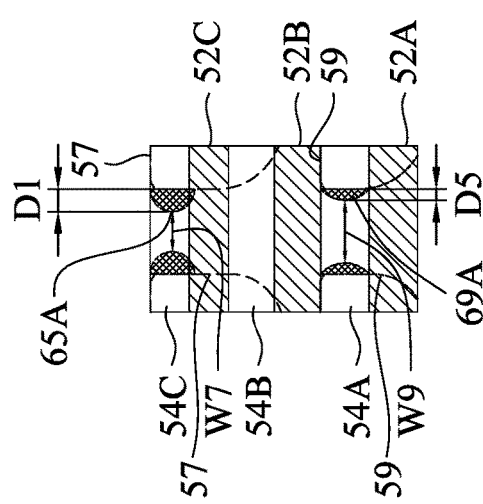
Figure 9O:
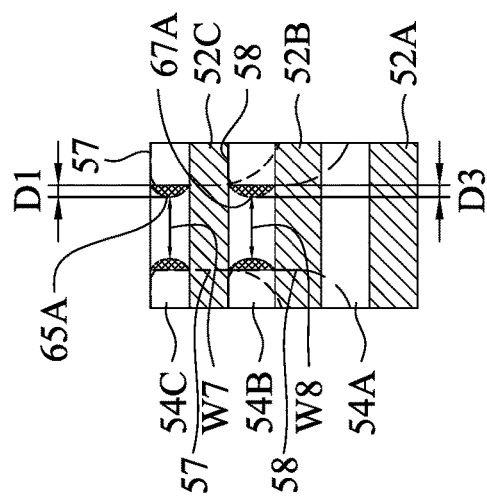
Figure 9P:
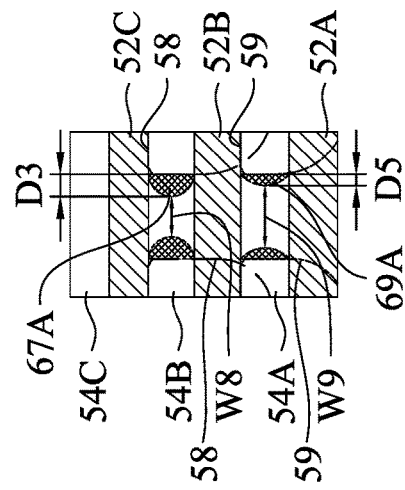
Figure 9Q:
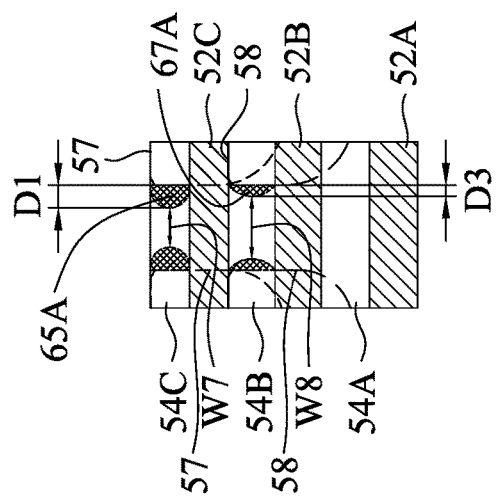
Figure 9R:
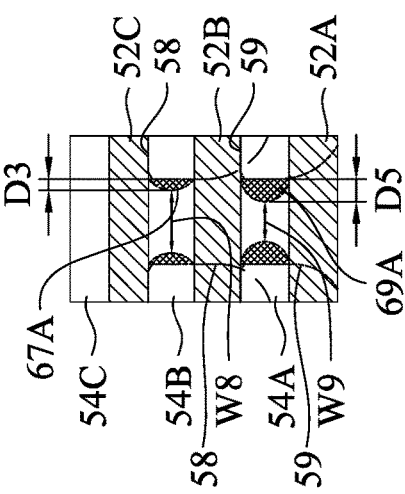
Figure 9T:
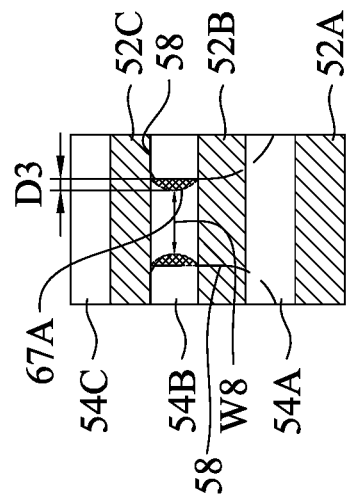

FIGS. 9C through 9T illustrate devices in accordance with various embodiments. Unless specified otherwise, like reference numerals represent like components in the embodiment shown in FIGS. 1 through 9B formed by like processes. Accordingly, the process steps and applicable materials may not be repeated herein.

FIG. 9C illustrates a region 46 of FIG. 9B after the implantation processes 61-63 have been performed according to some embodiments. In FIG. 9C, the distance D1 of the region 65A is less than the distance D3 of the region 67A, and the distance D3 of the region 67A is less than the distance D5 of the region 69A. This may be achieved by performing the implantation process 61 with a first implant dose, the implantation process 62 with a second implant dose and the implantation process 63 with a third implant dose. The first implant dose is less than the second implant dose, and the second implant dose is less than the third implant dose. As a result, the seventh width W7 is greater than the eighth width W8, and the eighth width W8 is greater than the ninth width W9.

FIG. 9D illustrates a region 46 of FIG. 9B after the implantation processes 61-63 have been performed according to some embodiment. In FIG. 9D, the distance D1 of the region 65A is greater than the distance D3 of the region 67A, and the distance D3 of the region 67A is greater than the distance D5 of the region 69A. This may be achieved by performing the implantation process 61 with a first implant dose, the implantation process 62 with a second implant dose and the implantation process 63 with a third implant dose. The first implant dose is greater than the second implant dose, and the second implant dose is greater than the third implant dose. As a result, the seventh width W7 is less than the eighth width W8, and the eighth width W8 is less than the ninth width W9.

FIG. 9E illustrates a region 46 of FIG. 9B after the implantation processes 61-63 have been performed according to some embodiments. In FIG. 9E, the distance D1 of the region 65A is greater than the distance D5 of the region 69A, and the distance D1 of the region 65A is less than the distance D3 of the region 67A. This may be achieved by performing the implantation process 61 with a first implant dose, the implantation process 62 with a second implant dose and the implantation process 63 with a third implant dose, wherein the first implant dose is greater than the third implant dose, and the first implant dose is less than the second implant dose. As a result, the seventh width W7 is less than the ninth width W9, and the eighth width W8 is less than the seventh width W7. In an embodiment, the distance D1 of the region 65A is less than the distance D5 of the region 69A, and the distance D5 of the region 69A is less than the distance D3 of the region 67A. This may be achieved by performing the implantation process 61 with a first implant dose, the implantation process 62 with a second implant dose and the implantation process 63 with a third implant dose, wherein the first implant dose is less than the third implant dose, and the third implant dose is less than the second implant dose. As a result, the seventh width W7 is greater than the ninth width W9, and the ninth width W9 is greater than the eighth width W8.

FIG. 9F illustrates a region 46 of FIG. 9B after the implantation processes 61-63 have been performed according to some embodiments. In FIG. 9F, the distance D1 of the region 65A is equal to the distance D3 of the region 67A, and the distance D3 of the region 67A is equal to the distance D5 of the region 69A. This may be achieved by performing the implantation process 61 with a first implant dose, the implantation process 62 with a second implant dose and the implantation process 63 with a third implant dose, wherein the first implant dose is equal to the second implant dose, and the second implant dose is equal to the third implant dose. As a result, the seventh width W7, the eighth width W8 and the ninth width W9 are equal.

FIG. 9G illustrates a region 46 of FIG. 9B after the implantation processes 61-63 have been performed according to some embodiments. In FIG. 9G, the distance D3 of the region 67A is less than the distance D1 of the region 65A, and the distance D1 of the region 65A is less than the distance D5 of the region 69A. This may be achieved by performing the implantation process 61 with a first implant dose, the implantation process 62 with a second implant dose and the implantation process 63 with a third implant dose, wherein the first implant dose is greater than the second implant dose, and the first implant dose is less than the third implant dose. As a result, the seventh width W7 is greater than the ninth width W9, and the seventh width W7 is less than the eighth width W8. In an embodiment, the distance D3 of the region 67A is less than the distance D5 of the region 69A, and the distance D5 of the region 69A is less than the distance D1 of the region 65A. This may be achieved by performing the implantation process 61 with a first implant dose, the implantation process 62 with a second implant dose and the implantation process 63 with a third implant dose, wherein the second implant dose is less than the third implant dose, and the third implant dose is less than the first implant dose. As a result, the eighth width W8 is greater than the ninth width W9, and the ninth width W9 is greater than the seventh width W7.

FIG. 9H illustrates a region 46 of FIG. 9B after the implantation processes 61-63 have been performed according to some embodiments. In FIG. 9H, the distance D1 of the region 65A is equal to the distance D3 of the region 67A, and the distance D3 of the region 67A and the distance D1 of the region 65A are less than the distance D5 of the region 69A. This may be achieved by performing the implantation process 61 with a first implant dose, the implantation process 62 with a second implant dose and the implantation process 63 with a third implant dose, wherein the first implant dose is equal to the second implant dose, and the second implant dose and the first implant dose are less than the third implant dose. As a result, the seventh width W7 and the eighth width W8 are equal, and the seventh width W7 and the eighth width W8 are greater than the ninth width W9.

FIG. 9I illustrates a region 46 of FIG. 9B after the implantation processes 61-63 have been performed according to some embodiments. In FIG. 9I, the distance D3 of the region 67A is equal to the distance D5 of the region 69A, and the distance D3 of the region 67A and the distance D5 of the region 69A are less than the distance D1 of the region 65A. This may be achieved by performing the implantation process 61 with a first implant dose, the implantation process 62 with a second implant dose and the implantation process 63 with a third implant dose, wherein the second implant dose is equal to the third implant dose, and the second implant dose and the third implant dose are less than the first implant dose. As a result, the eighth width W8 and the ninth width W9 are equal, and the eighth width W8 and the ninth width W9 are greater than the seventh width W7.

FIG. 9J illustrates a region 46 of FIG. 9B after the implantation processes 61-63 have been performed according to some embodiments. In FIG. 9J, the distance D1 of the region 65A is equal to the distance D3 of the region 67A, and the distance D1 of the region 65A and the distance D3 of the region 67A are greater than the distance D5 of the region 69A. This may be achieved by performing the implantation process 61 with a first implant dose, the implantation process 62 with a second implant dose and the implantation process 63 with a third implant dose, wherein the first implant dose is equal to the second implant dose, and the first implant dose and the second implant dose are greater than the third implant dose. As a result, the seventh width W7 and the eighth width W8 are equal, and the seventh width W7 and the eighth width W8 are less than the ninth width W9.

FIG. 9K illustrates a region 46 of FIG. 9B after the implantation processes 61-63 have been performed according to some embodiments. In FIG. 9K, the distance D1 of the region 65A is less than the distance D3 of the region 67A and the distance D5 of the region 69A, and the distance D3 of the region 67A and the distance D5 of the region 69A are equal. This may be achieved by performing the implantation process 61 with a first implant dose, the implantation process 62 with a second implant dose and the implantation process 63 with a third implant dose, wherein the second implant dose is equal to the third implant dose, and the first implant dose is less than the second implant dose and the third implant dose. As a result, the eighth width W8 and the ninth width W9 are equal, and the seventh width W7 is greater than the eighth width W8 and the ninth width W9.

FIG. 9L illustrates a region 46 of FIG. 9B after the implantation processes 61 and 63 have been performed according to some embodiments, but the implantation process 62 has been omitted. Since doped region 58 is not present, there is no laterally straggled region 67A. In FIG. 9L, the distance D1 of the region 65A is less than the distance D5 of the region 69A. This may be achieved by performing the implantation process 61 with a first implant dose and the implantation process 63 with a third implant dose, wherein the third implant dose is greater than the first implant dose. As a result, the seventh width W7 is greater than the ninth width W9.

FIG. 9M illustrates a region 46 of FIG. 9B after the implantation processes 61 and 63 have been performed according to some embodiments, but the implantation process 62 has been omitted. Since doped region 58 is not present, there is no laterally straggled region 67A. In FIG. 9M, the distance D1 of the region 65A is greater than the distance D5 of the region 69A. This may be achieved by performing the implantation process 61 with a first implant dose and the implantation process 63 with a third implant dose, wherein the third implant dose is less than the first implant dose. As a result, the seventh width W7 is less than the ninth width W9.

FIG. 9N illustrates a region 46 of FIG. 9B after the implantation processes 61 and 62 have been performed according to some embodiments, but the implantation process 63 has been omitted. Since doped region 59 is not present, there is no laterally straggled region 69A. In FIG. 9N, the distance D1 of the region 65A is less than the distance D3 of the region 67A. This may be achieved by performing the implantation process 61 with a first implant dose and the implantation process 62 with a second implant dose, wherein the first implant dose is less than the second implant dose. As a result, the seventh width W7 is greater than the eighth width W8.

FIG. 9O illustrates a region 46 of FIG. 9B after the implantation processes 61 and 62 have been performed according to some embodiments, but the implantation process 63 has been omitted. Since doped region 59 is not present, there is no laterally straggled region 69A. In FIG. 9O, the distance D1 of the region 65A is greater than the distance D3 of the region 67A. This may be achieved by performing the implantation process 61 with a first implant dose and the implantation process 62 with a second implant dose, wherein the first implant dose is greater than the second implant dose. As a result, the seventh width W7 is less than the eighth width W8.

FIG. 9P illustrates a region 46 of FIG. 9B after the implantation processes 61 and 62 have been performed according to some embodiments, but the implantation process 63 has been omitted. Since doped region 59 is not present, there is no laterally straggled region 69A. In FIG. 9P, the distance D1 of the region 65A is equal to the distance D3 of the region 67A. This may be achieved by performing the implantation process 61 with a first implant dose and the implantation process 62 with a second implant dose, wherein the first implant dose and the second implant dose are equal. As a result, the seventh width W7 and the eighth width W8 are equal.

FIG. 9Q illustrates a region 46 of FIG. 9B after the implantation processes 62 and 63 have been performed according to some embodiments, but the implantation process 61 has been omitted. Since doped region 57 is not present, there is no laterally straggled region 65A. In FIG. 9Q, the distance D3 of the region 67A is less than the distance D5 of the region 69A. This may be achieved by performing the implantation process 62 with a second implant dose and the implantation process 63 with a third implant dose, wherein the second implant dose is less than the third implant dose. As a result, the eighth width W8 is greater than the ninth width W9.

FIG. 9R illustrates a region 46 of FIG. 9B after the implantation processes 62 and 63 have been performed according to some embodiments, but the implantation process 61 has been omitted. Since doped region 57 is not present, there is no laterally straggled region 65A. In FIG. 9R, the distance D3 of the region 67A is greater than the distance D5 of the region 69A. This may be achieved by performing the implantation process 62 with a second implant dose and the implantation process 63 with a third implant dose, wherein the second implant dose is greater than the third implant dose. As a result, the eighth width W8 is less than the ninth width W9.

Figure 9S:
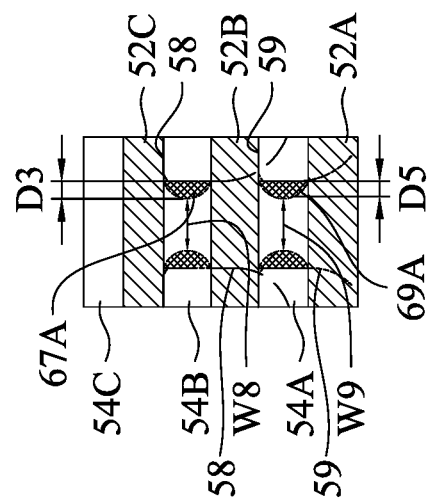

FIG. 9S illustrates a region 46 of FIG. 9B after the implantation processes 62 and 63 have been performed according to some embodiments, but the implantation process 61 has been omitted. Since doped region 57 is not present, there is no laterally straggled region 65A. In FIG. 9S, the distance D3 of the region 67A is equal to the distance D5 of the region 69A. This may be achieved by performing the implantation process 62 with a second implant dose and the implantation process 63 with a third implant dose, wherein the second implant dose and the third implant dose are equal. As a result, the eighth width W8 is equal to the ninth width W9.

FIG. 9T illustrates a region 46 of FIG. 9B after the implantation process 62 has been performed according to some embodiments, but the implantation processes 61 and 63 have been omitted. Since doped regions 57 and 59 are not present, there are no laterally straggled region 65A and region 69A. In other embodiments (not separately illustrated), the implantation process 61 may be performed, but the implantation processes 62 and 63 may be omitted. Since doped regions 58 and 59 are not present, there are no laterally straggled region 67A and region 69A. In other embodiments (not separately illustrated), the implantation process 63 may be performed, but the implantation processes 61 and 62 may be omitted. Since doped regions 57 and 58 are not present, there are no laterally straggled region 65A and region 67A.

Figure 10B:
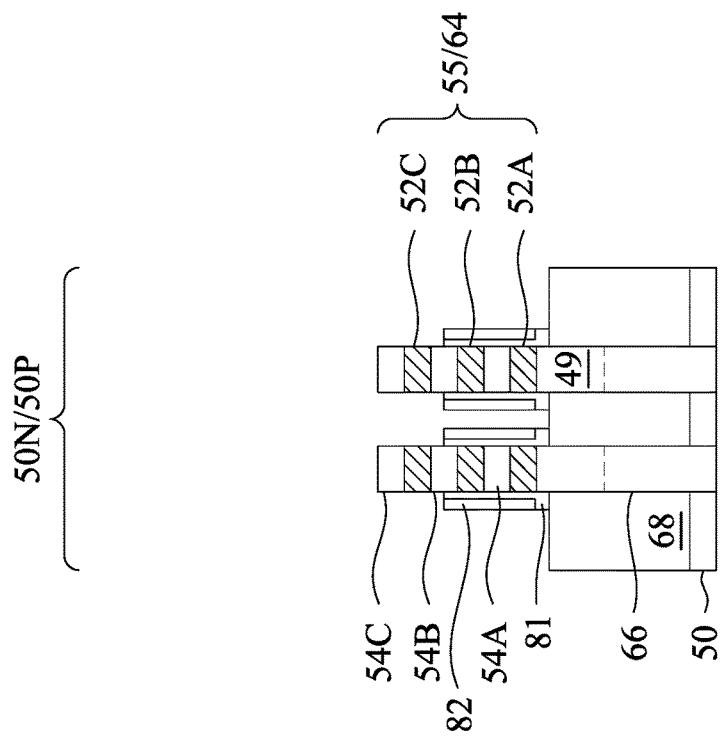
Figure 10A:
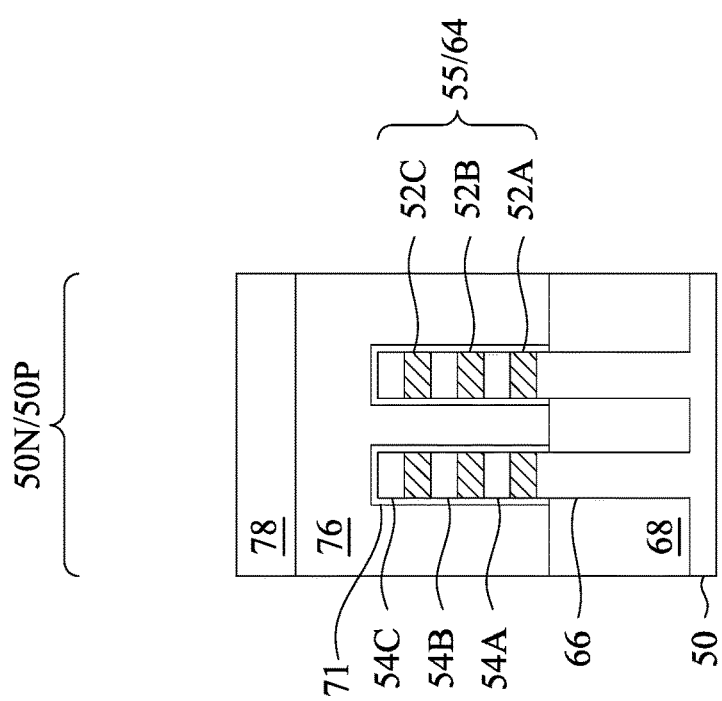
Figure 10C:
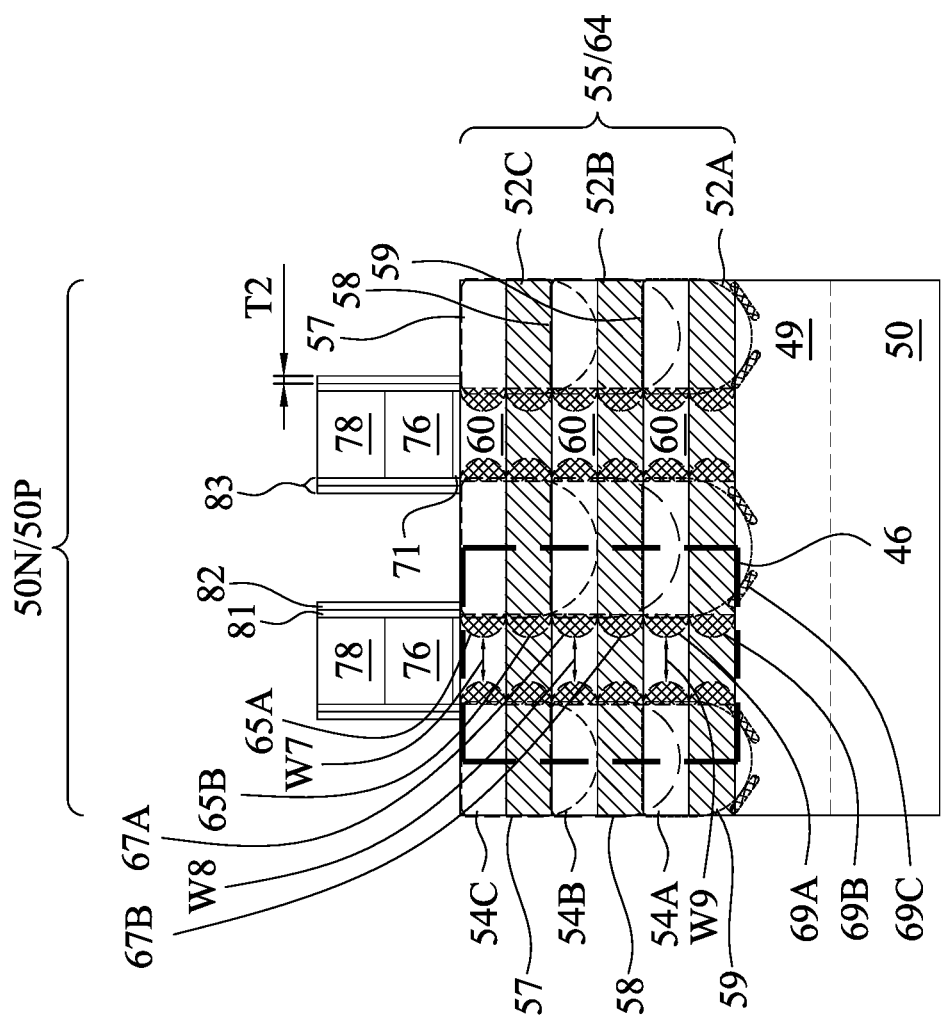

In FIGS. 10A through 10C, second spacers 82 are formed by depositing a second spacer layer over the structures illustrated in FIGS. 9A and 9B, and then subsequently patterning the second spacer layer. The second spacer layer is formed on top surfaces of the STI regions 68; top surfaces and sidewalls of the nanostructures 55; top surfaces of the masks 78; and top surfaces and sidewalls of the first spacers 81. The second spacer layer may be formed of silicon oxide, silicon nitride, silicon oxynitride, or the like, using techniques such as thermal oxidation or deposited by CVD, ALD, or the like. In an embodiment, the second spacer layer may be formed of a material having a different etch rate than the material of the first spacers 81. The second spacer layer is then etched to form second spacers 82. The second spacer layer may be etched using a suitable etching process, such as an isotropic etching process (e.g., a wet etching process), an anisotropic etching process (e.g., a dry etching process), or the like. In an embodiment, the second spacers 82 may have a thickness T2 in a range from 3 nm to 5 nm. The first spacers 81 and the second spacers 82 may be referred to jointly as the spacers 83 in subsequent Figures.

Advantages can be achieved as a result of forming the first spacers 81 having a thickness T1 in a range from 3 nm to 5 nm on the sidewalls of the masks 78 and the dummy gates 76, and then performing implantation processes 61-63 on nanostructures 55 and/or fins 66 to introduce dopants into exposed areas of the nanostructures 55 and/or fins 66 that are not covered by the first spacers 81, the dummy gates 76 and the masks 78. The implantation processes 61-63 are performed using modulated ion beams with different implant energies and implant doses. Subsequently, the second spacers 82 are formed on sidewalls of the first spacers 81. These advantages include the ability to control the lateral straggle of dopants at different depths into the channel regions 60 of the nanostructures 55, as well as allowing for increased lateral straggle of the dopants into the channel regions 60 under the first spacers 82, the second spacers 82, and the dummy gates 76. This allows for the straggled dopants to extend further into the channel regions 60 of the nanostructures 55 and results in shortened effective channel lengths and therefore reduced channel resistance ($R_{ch}$).

Figures 11A, 11B:
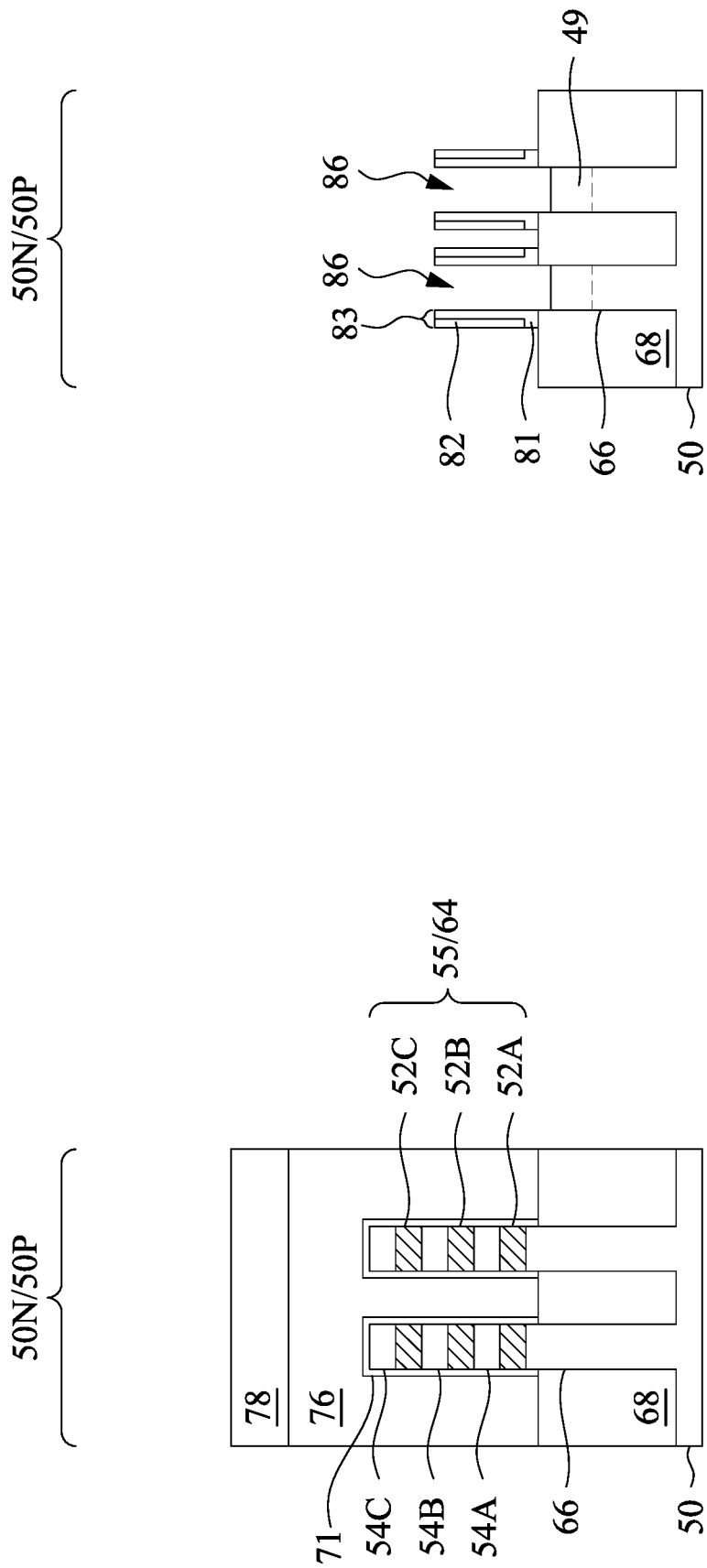
Figure 11C:
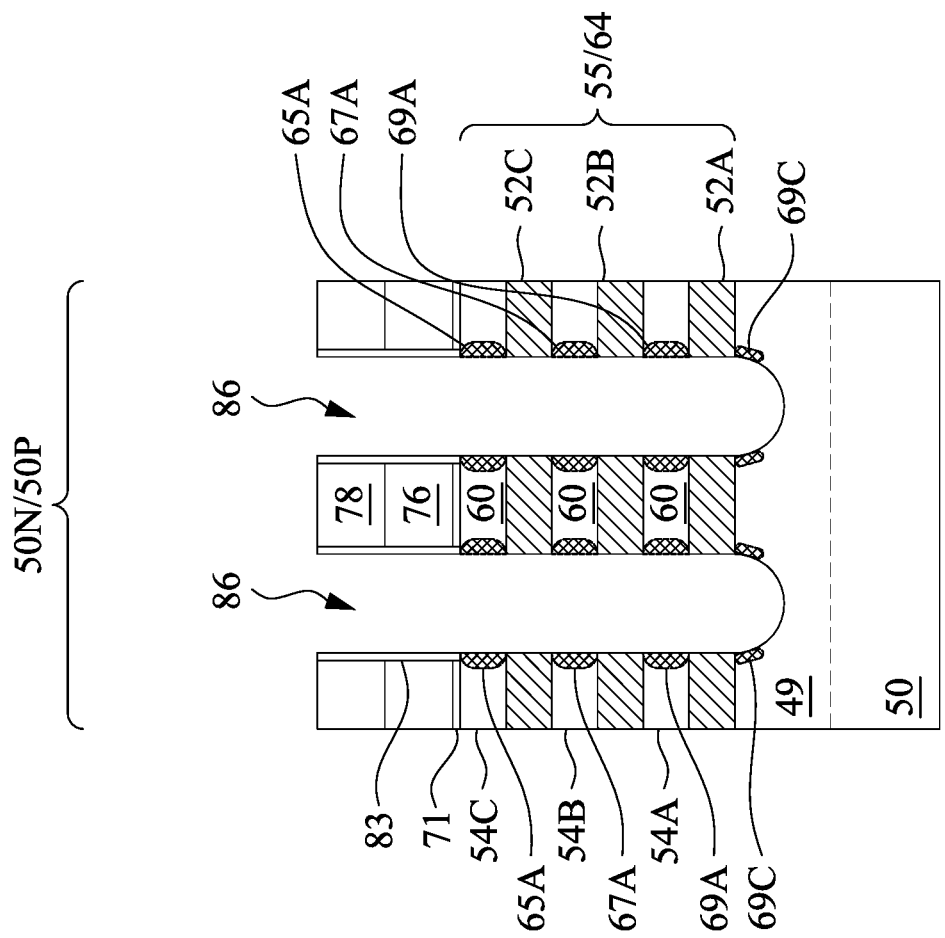

In FIGS. 11A through 11C, first recesses 86 are formed in the nanostructures 55 and the fins 66, in accordance with some embodiments. Epitaxial materials and epitaxial source/drain regions will be subsequently formed in the first recesses 86. The first recesses 86 may extend through the first nanostructures 52, the second nanostructures 54, and partially through the fins 66. In an embodiment, the first recesses 86 may extend partially into the APT region 49 as illustrated in FIG. 11C. In other embodiments, the first recesses 86 may extend through the APT region 49 and may further extend partially through the substrate 50. In an embodiment, the nanostructures 55 and the fins 66 may be etched such that bottom surfaces of the first recesses 86 are disposed below the top surfaces of the STI regions 68 or the like as illustrated by FIG. 11B. In other embodiments, top surfaces of the STI regions 68 may be level with bottom surfaces of the first recesses 86.

The first recesses 86 may be formed by etching the nanostructures 55 and the fins 66 using anisotropic etching processes, such as RIE, NBE, or the like. The spacers 83 and the masks 78 mask portions of the fins 66, the nanostructures 55, and the substrate 50 during the etching processes used to form the first recesses 86. A single etch process or multiple etch processes may be used to etch each layer of the nanostructures 55. Timed etch processes may be used to stop the etching after the first recesses 86 reach desired depths.

Figure 12:
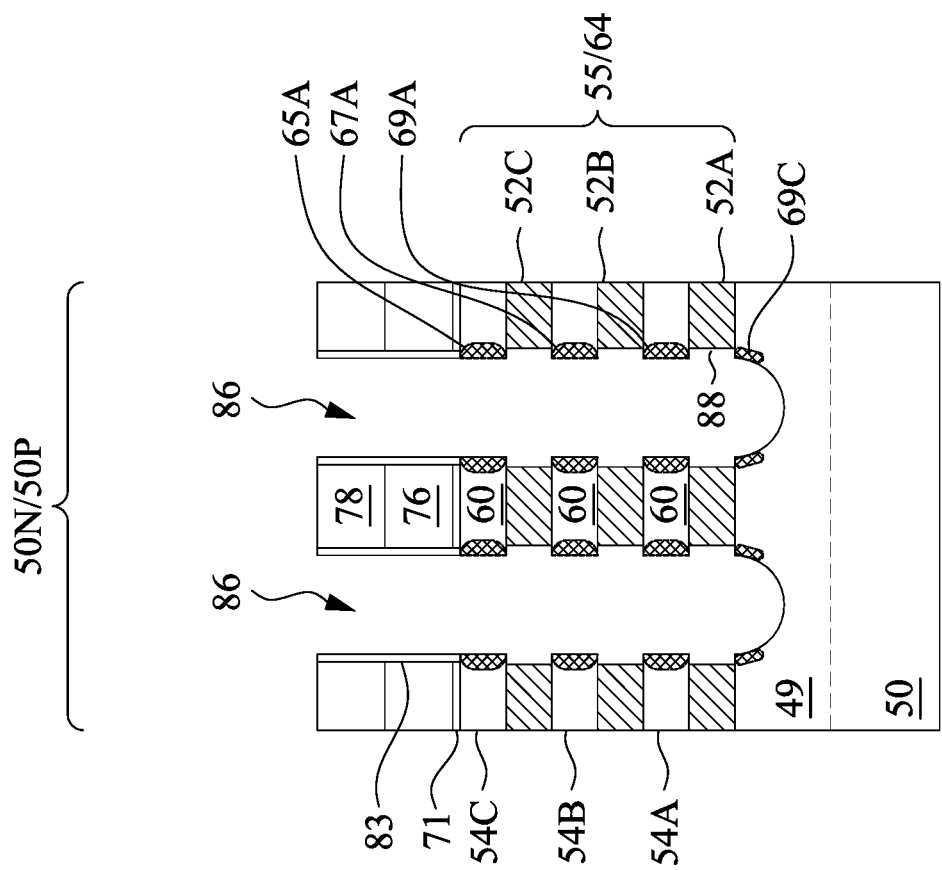

In FIG. 12, portions of sidewalls of the layers of the multi-layer stack 64 formed of the first semiconductor materials (e.g., the first nanostructures 52) exposed by the first recesses 86 are etched to form sidewall recesses 88. Although sidewalls of the first nanostructures 52 adjacent the sidewall recesses 88 are illustrated as being straight in FIG. 12, the sidewalls may be concave or convex. The sidewalls may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52.

Figure 13:
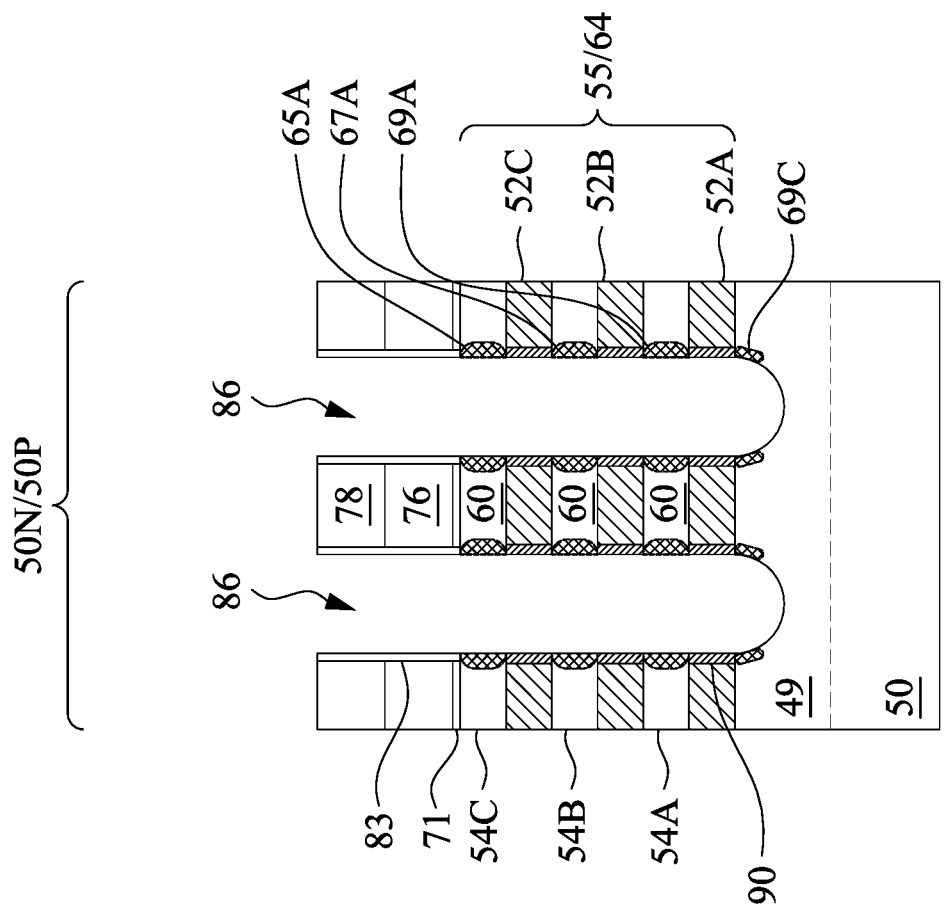

In FIG. 13, inner spacers 90 are formed in the sidewall recess 88. The inner spacers 90 may be formed by depositing an inner spacer layer (not separately illustrated) over the structures illustrated in FIG. 12. The inner spacers 90 act as isolation features between subsequently formed source/drain regions and the gate dielectric layers 120 and the gate electrodes 102 (shown subsequently in FIGS. 21A and 21B). As will be discussed in greater detail below, epitaxial source/drain regions and epitaxial materials will be formed in the first recesses 86, while the first nanostructures 52A, 52B and 52C will be replaced with the gate dielectric layers 120 and the gate electrodes 102.

The inner spacer layer may be deposited by a conformal deposition process, such as CVD, ALD, or the like. The inner spacer layer may comprise a material such as silicon carbonitride (SiCN) or silicon oxycarbonitride (SiOCN). In other embodiments, silicon nitride or silicon oxynitride, or any suitable material, such as low-dielectric constant (low-k) materials having a k-value less than about 3.5, may be utilized. The inner spacer layer may then be anisotropically etched to form the inner spacers 90. Although outer sidewalls of the inner spacers 90 are illustrated as being flush with sidewalls of the second nanostructures 54, the outer sidewalls of the inner spacers 90 may extend beyond or be recessed from sidewalls of the second nanostructures 54. Moreover, although the outer sidewalls of the inner spacers 90 are illustrated as being straight in FIG. 13, the outer sidewalls of the inner spacers 90 may be concave or convex. The inner spacer layer may be etched by an anisotropic etching process, such as RIE, NBE, or the like. The inner spacers 90 may be used to prevent damage to subsequently formed source/drain regions (shown in FIGS. 16A through 16D) by subsequent etching processes, such as etching processes used to form the gate dielectric layers 120 and the gate electrodes 102 (shown in FIGS. 21A and 21B).

Figure 14B:
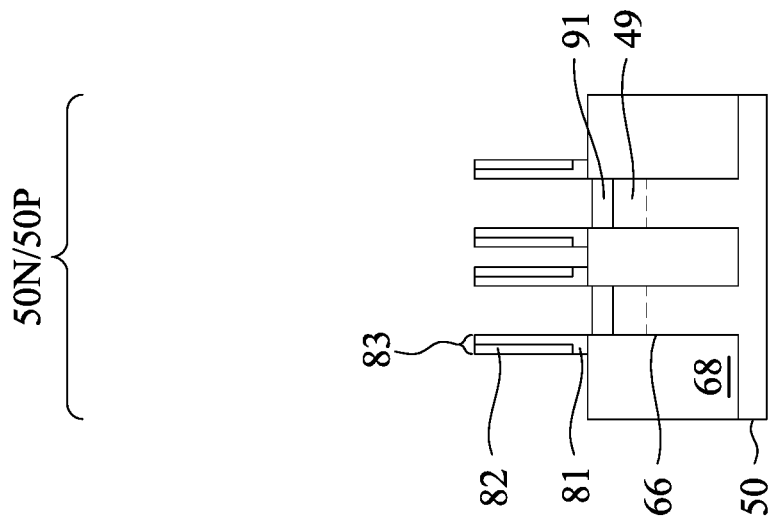
Figure 14A:
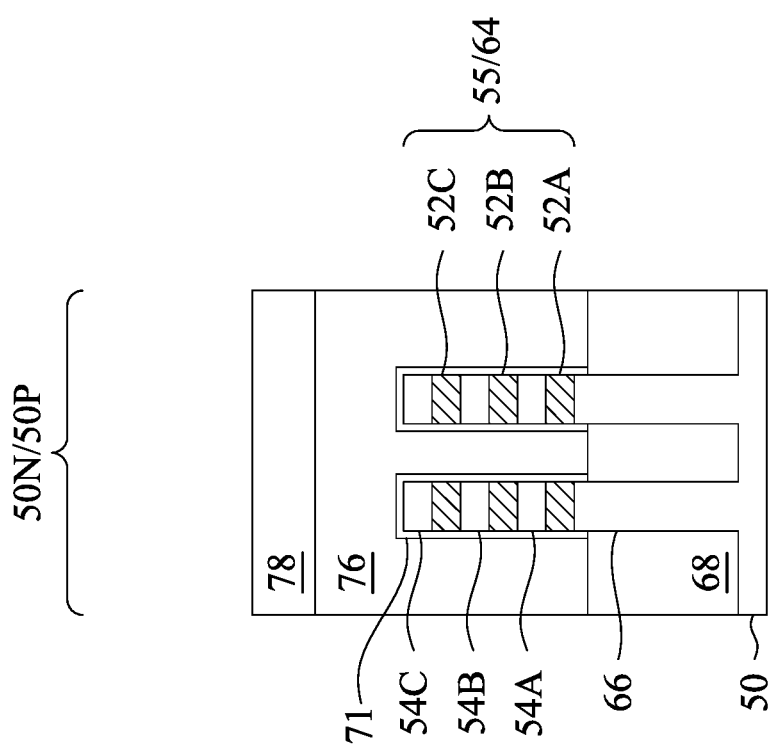
Figure 14C:
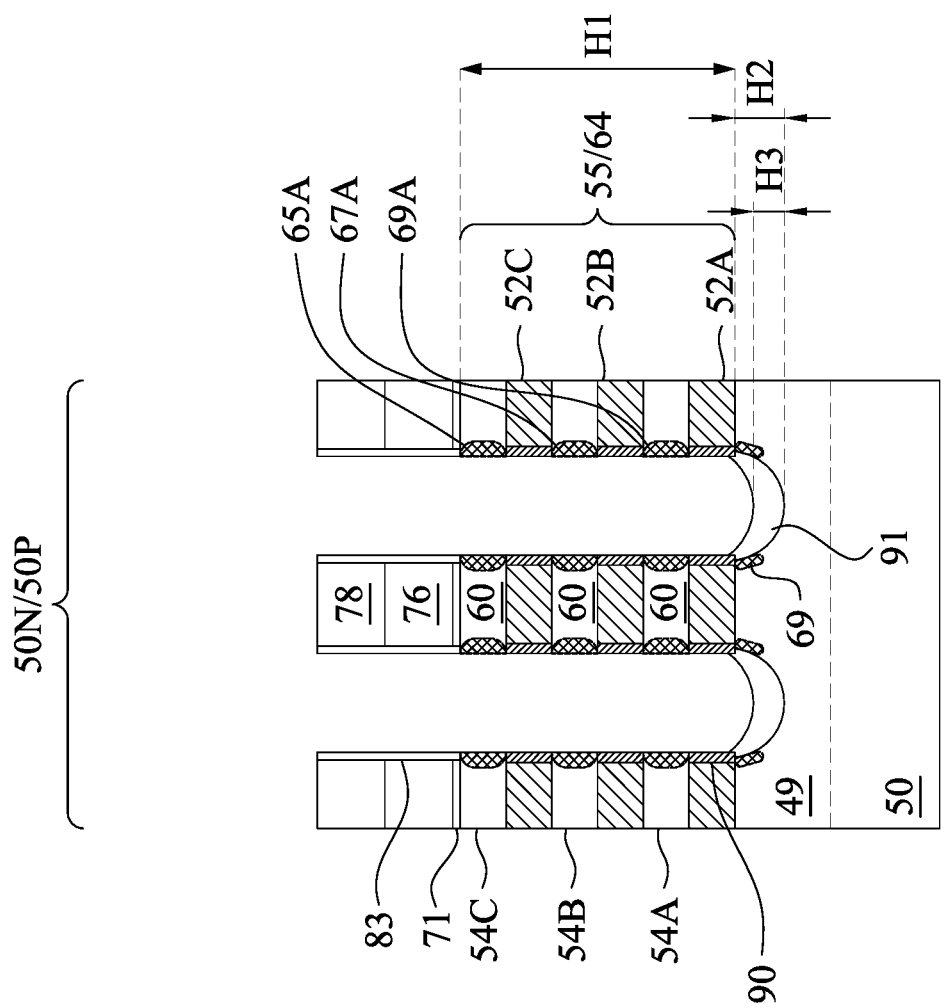

In FIGS. 14A through 14C, a first epitaxial material 91 is formed in the first recesses 86. The first epitaxial material 91 may be formed of undoped silicon or the like, which may be epitaxially grown using a process such as chemical vapor deposition (CVD), atomic layer deposition (ALD), vapor phase epitaxy (VPE), molecular beam epitaxy (MBE), or the like. Tuning of the parameters of the epitaxial growth process allows for bottom-up growth of the first epitaxial material 91 in the first recesses 86, such that growth of the first epitaxial material 91 takes place at bottom portions of the first recesses 86 before other portions of the first recesses 86. In some embodiments, no growth of the first epitaxial material 91 occurs on the sidewalls of the second nanostructures 54A-54C. In some embodiments, some growth of the first epitaxial material 91 occurs on the second nanostructures 54A-54C, but that growth is less than the amount of bottom-up growth in the first recesses 86. The first epitaxial material 91 may be formed to fill a bottom portion of the first recesses 86 that is disposed in the APT region 49. For example, the first epitaxial material 91 may be disposed between the APT region 49/substrate 50 and subsequently formed epitaxial source/drain regions 92 (shown in FIGS. 16A through 16D). During the formation of the first epitaxial material 91, no in-situ doping is performed and as a result, no dopants are present in the first epitaxial material 91.

Referring further to FIGS. 14A through 14C, the first epitaxial material 91 may have a curved top surface. In the illustrated embodiment, the first epitaxial material 91 may have a curved top surface with a concave profile and a curved bottom surface with a convex profile. In the illustrated embodiment, the first epitaxial material 91 may be in physical contact with a bottom surface and sidewalls of the inner spacers 90. In an embodiment, the first epitaxial material 91 may have a curved top surface that continuously curves from a first sidewall of a first inner spacer 90 to a second sidewall of a second inner spacer 90. In an embodiment, the first epitaxial material 91 may have a curved bottom surface that continuously curves from a first bottom surface of the first inner spacer 90 to a second bottom surface of the second inner spacer 90. In an embodiment, a second height H2 from a bottommost point of the nanostructures 55 to a bottommost point of the first epitaxial material 91 may be in a range from 15 nm to 35 nm. In an embodiment, a third height H3 from the bottommost point of a top surface of the first epitaxial material 91 to a bottommost point of the first epitaxial material 91 may be in a range from 15 nm to 30 nm. As shown in FIG. 14C, the bottommost point of a top surface of the first epitaxial material 91 is lower than the bottommost surface of the nanostructures 55 (for example, the bottom surface of first nanostructure 52A). In an embodiment, the entirety of a bottom surface of the first epitaxial material 91 may be in physical contact with the APT region 49. In an embodiment, a portion of the bottom surface of the first epitaxial material 91 may be in physical contact with the APT region 49.

Figure 15:
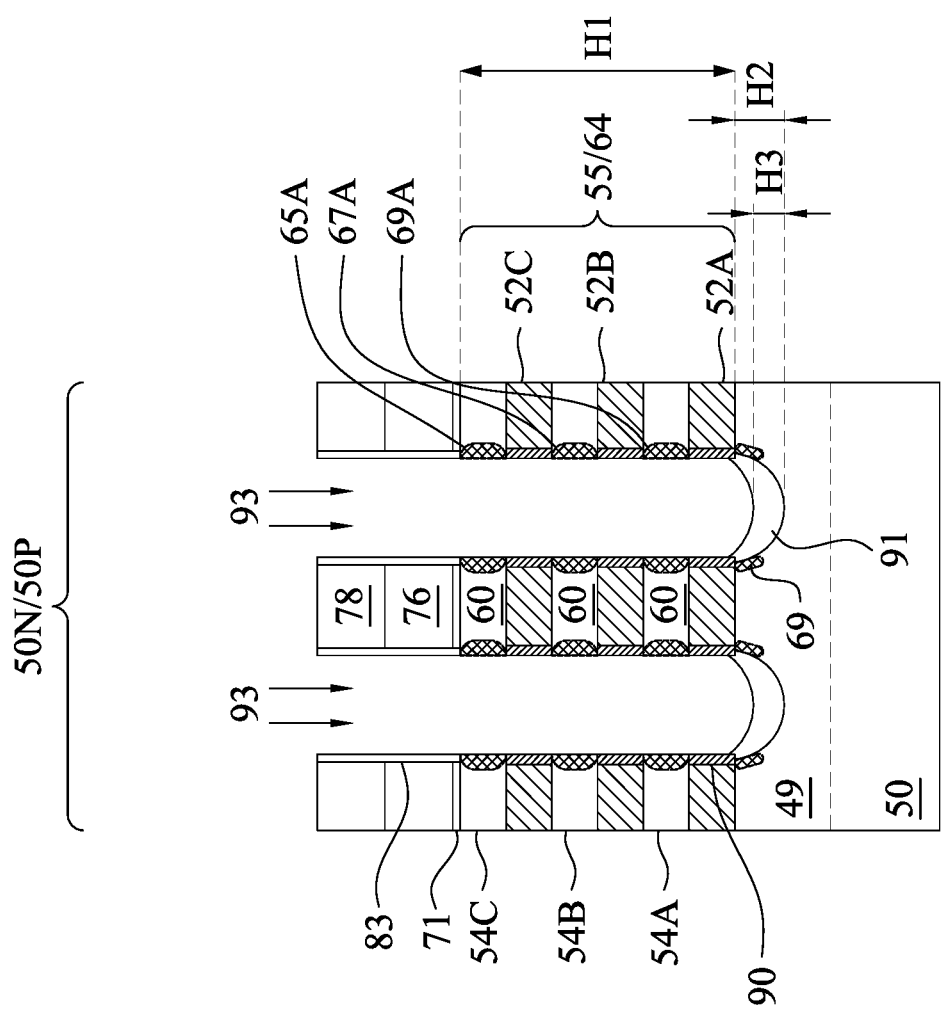

In FIG. 15, an implantation process 93 is performed on the first epitaxial material 91 to introduce dopants into the first epitaxial material 91. The implantation process 93 is used to create a gradient-doped profile in the first epitaxial material 91 and may be performed using a high current ion implanter, or the like. The implantation species may include ions formed from, arsenic (As), phosphorous (P), antimony (Sb), boron di-fluoride ($BF_2$), boron (B), combinations thereof, or the like. In an embodiment, the implantation process 93 introduces dopants derived from arsenic (As) and/or phosphorous (P) into the first epitaxial material 91 in the n-type region 50N, e.g., the NMOS region. In an embodiment, the implantation process 93 introduces dopants derived from antimony (Sb), boron di-fluoride ($BF_2$) and/or boron (B) into the first epitaxial material 91 in the p-type region 50P, e.g., the PMOS region. In this way, the first epitaxial material 91 may be doped with arsenic (As), phosphorous (P), antimony (Sb), boron di-fluoride ($BF_2$), boron (B), combinations thereof, or the like. The implantation process 93 introduces dopants into the first epitaxial material 91 that have a conductivity type opposite to a conductivity type of the APT region 49. The implantation species may be delivered using an ion beam such that after the implantation process 93, a dopant concentration of the implanted dopants in the first epitaxial material 91 is in the range from $1\times10^{20}$ atoms/$cm^3$ to $1\times10^{19}$ atoms/$cm^3$. The first epitaxial material 91 may have a gradient-doped profile after the implantation process 93 such that a dopant concentration of the first epitaxial material 91 decreases from a top surface of the first epitaxial material 91 in a direction towards the substrate 50. The first epitaxial material 91 may have a dopant concentration that is less than a dopant concentration of subsequently formed epitaxial source/drain regions 92 (shown in FIGS. 16A through 16D).

Advantages can be achieved as a result of forming first recesses 86 in the nanostructures 55 and the fin 66, and subsequently forming the first epitaxial material 91 (for example, an undoped silicon layer) in the first recesses 86. An implantation process 93 is performed on the first epitaxial material 91 such that the first epitaxial material 91 has a gradient-doped profile. Epitaxial source/drain regions 92 are then formed in the first recesses 86 over the first epitaxial material 91. These advantages include a reduction of the enlarged electric field that forms as result of prior implantation processes, and therefore mitigation of the junction leakage current ($I_{boff}$) caused by the enlarged electric field.

Figure 16B:
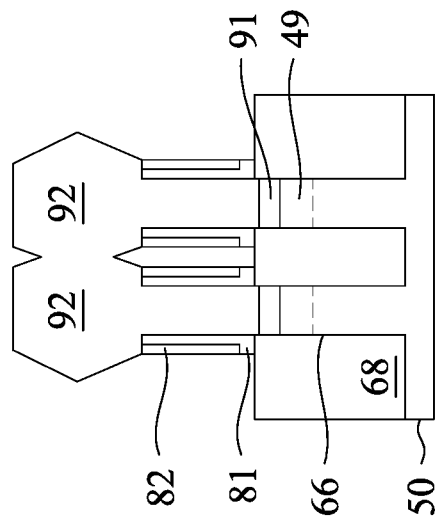
Figure 16A:
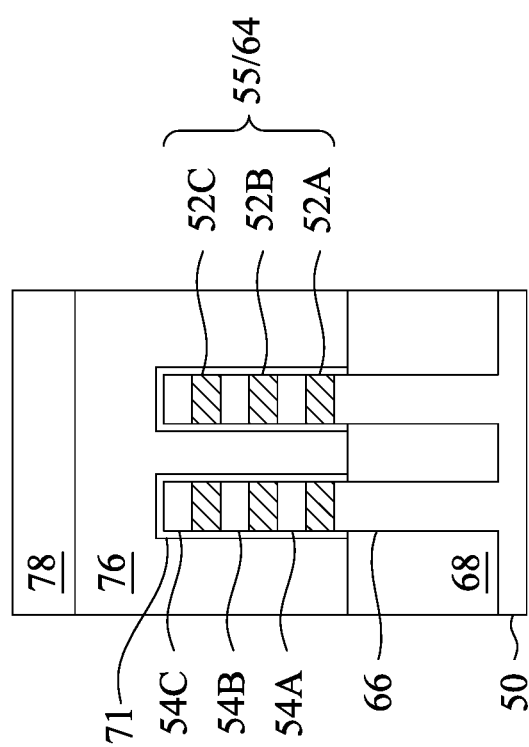
Figures 16C, 16D:
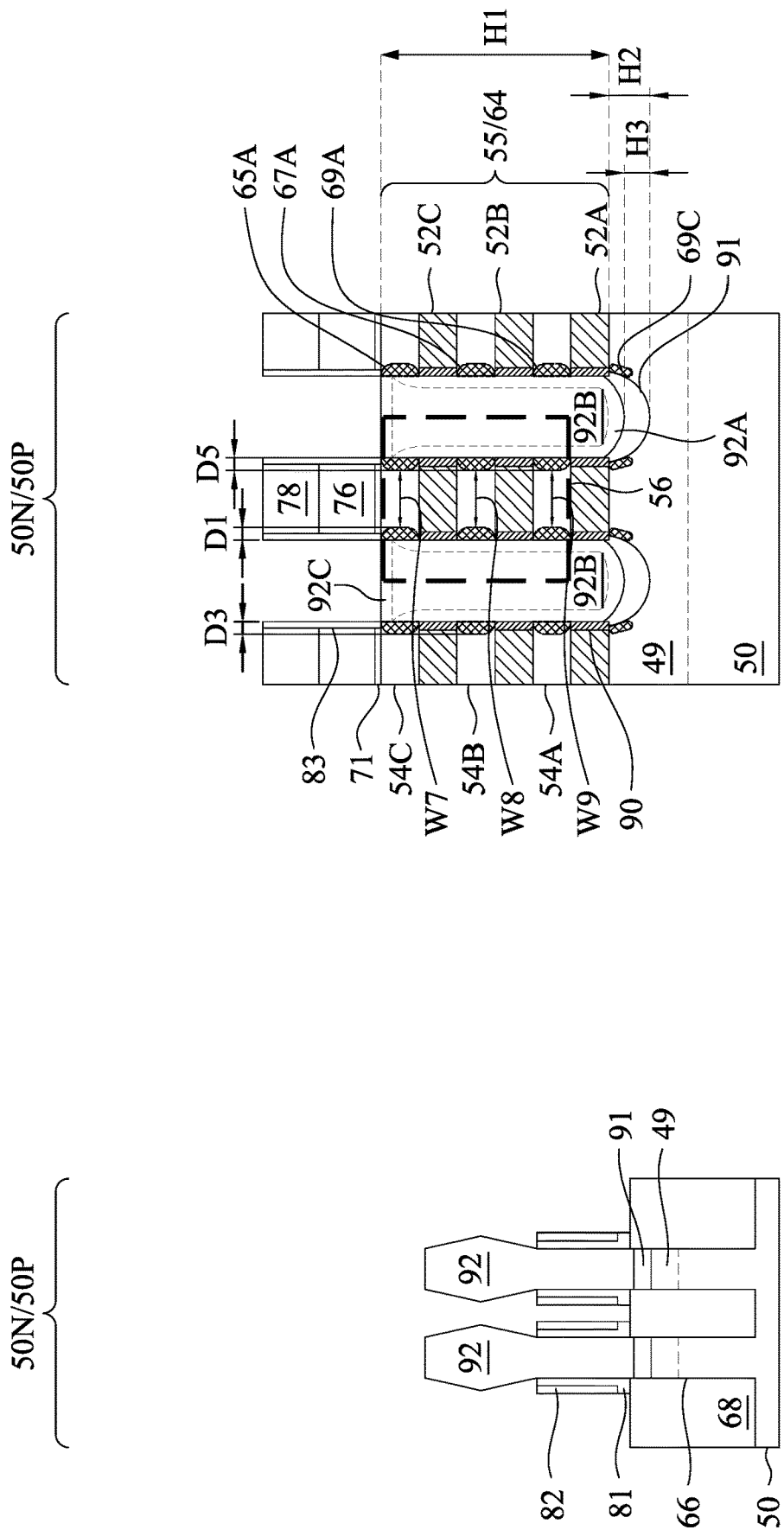

In FIGS. 16A through 16D, epitaxial source/drain regions 92 are formed in the first recesses 86 over the first epitaxial material 91. In some embodiments, the epitaxial source/drain regions 92 may exert stress on the second nanostructures 54A, 54B, and 54C thereby improving performance. As illustrated in FIG. 16D, the epitaxial source/drain regions 92 are formed in the first recesses 86 such that each dummy gate 76 is disposed between respective neighboring pairs of the epitaxial source/drain regions 92. In some embodiments, the spacers 83 are used to separate the epitaxial source/drain regions 92 from the dummy gates 76 and the inner spacers 90 are used to separate the epitaxial source/drain regions 92 from the first nanostructures 52A, 52B and 52C by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86, in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54A, 54B, and 54C such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions in the p-type region 50P, e.g., the PMOS region, may be formed by masking the n-type region 50N, e.g., the NMOS region. Then, the epitaxial source/drain regions 92 are epitaxially grown in the first recesses 86, in the p-type region 50P. The epitaxial source/drain regions 92 may include any acceptable material appropriate for p-type nano-FETs. For example, if the second nanostructures 54 are silicon, the epitaxial source/drain regions 92 may comprise materials exerting a compressive strain on the second nanostructures 54 such as silicon-germanium, boron doped silicon-germanium, germanium, germanium tin, or the like. The epitaxial source/drain regions 92 may also have surfaces raised from respective surfaces of the nanostructures 55 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The epitaxial source/drain regions 92 may have an impurity concentration of between about $1\times10^{19}$ atoms/$cm^3$ and about $1\times10^{21}$ atoms/$cm^3$. In an embodiment, the epitaxial source/drain regions 92 may have an impurity (also referred to as dopant) concentration that is 2 to 3 orders of magnitude greater than a dopant concentration of the regions 65A, 67A, 69A, or 69C. In an embodiment, the epitaxial source/drain regions 92 may have an impurity (also referred to as dopant) concentration that is greater than a dopant concentration of each of the doped regions 57, 58 or 59 (shown previously in FIG. 9A). In an embodiment, the epitaxial source/drain regions 92 may have a dopant concentration that is greater than a dopant concentration of the first epitaxial material 91. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 16B. In other embodiments, adjacent epitaxial source/drain regions 92 remain separated after the epitaxy process is completed as illustrated by FIG. 16C. In the embodiments illustrated in FIGS. 16B and 16C, the spacers 83 may be formed to a top surface of the STI regions 68 thereby blocking the epitaxial growth. In some other embodiments, the spacers 83 may cover portions of the sidewalls of the nanostructures 55 further blocking the epitaxial growth. In some other embodiments, the spacer etch used to form the spacers 83 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layers 92A, the second semiconductor material layers 92B, and the third semiconductor material layers 92C may be formed of different semiconductor materials and may be doped to different dopant concentrations. In some embodiments, the first semiconductor material layers 92A may have a dopant concentration less than the second semiconductor material layers 92B. In some embodiments, the second semiconductor material layers 92B may have a dopant concentration less than the third semiconductor material layers 92C. In some embodiments, the first semiconductor material layers 92A may have a dopant concentration greater than the first epitaxial material 91. In some embodiments, the second semiconductor material layers 92B may have a dopant concentration greater than the first epitaxial material 91. In some embodiments, the third semiconductor material layers 92C may have a dopant concentration greater than the first epitaxial material 91. In some embodiments, the first semiconductor material layer 92A may have a lesser germanium concentration than the second semiconductor material layer 92B. In some embodiments, the second semiconductor material layer 92B may have a lesser germanium concentration than the third semiconductor material layer 92C. In embodiments in which the epitaxial source/drain regions 92 comprise three semiconductor material layers, the first semiconductor material layers 92A may be deposited, the second semiconductor material layers 92B may be deposited over the first semiconductor material layers 92A, and the third semiconductor material layers 92C may be deposited over the second semiconductor material layers 92B.

Figure 16E:
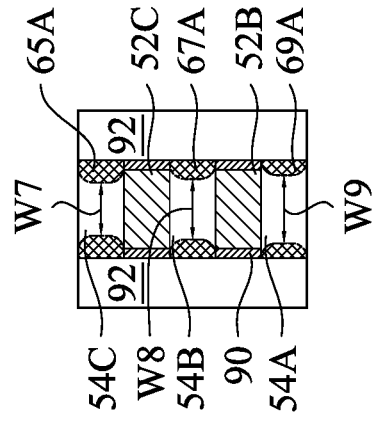

Still referring to FIGS. 16A through 16D, the lateral straggle in the region 65A may extend under the spacers 83, the masks 78 and the dummy gates 76 by the distance D1 from a first sidewall of the epitaxial source/drain regions 92. The lateral straggle in the region 67A may extend under the spacers 83, the masks 78 and the dummy gates 76 by the distance D3 from the first sidewall of the epitaxial source/drain regions 92. The lateral straggle in the region 69A may extend under the spacers 83, the masks 78 and the dummy gates 76 by the distance D5 from the first sidewall of the epitaxial source/drain regions 92. As shown in FIG. 16D, the region 65A, 67A, and 69A may be in physical contact with the epitaxial source/drain regions 92, In an embodiment, the region 69C may be in physical contact with the first epitaxial material 91, FIGS. 16E through 16V illustrate devices corresponding to the embodiments of FIGS. 9C through 9T, respectively. Unless specified otherwise, like reference numerals in this embodiment (and subsequently discussed embodiments) represent like components in the embodiment shown in FIGS. 1 through 16D formed by like processes. Accordingly, the process steps and applicable materials may not be repeated herein.

FIG. 16E illustrates the region 56 of FIG. 16D corresponding to the embodiment of FIG. 9C, after the formation of the epitaxial source/drain regions 92 in the first recesses 86. In an embodiment, the distance D1 of the region 65A is less than the distance D3 of the region 67A, and the distance D3 of the region 67A is less than the distance D5 of the region 69A. As a result, the seventh width W7 is greater than the eighth width W8, and the eighth width W8 is greater than the ninth width W9.

Figure 16F:
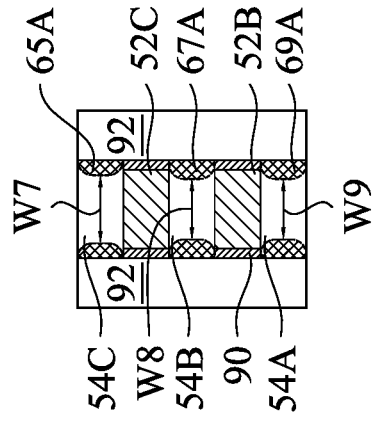

FIG. 16F illustrates the region 56 of FIG. 16D corresponding to the embodiment of FIG. 9D, after the formation of the epitaxial source/drain regions 92 in the first recesses 86. In an embodiment, the distance D1 of the region 65A is greater than the distance D3 of the region 67A, and the distance D3 of the region 67A is greater than the distance D5 of the region 69A. As a result, the seventh width W7 is less than the eighth width W8, and the eighth width W8 is less than the ninth width W9.

Figure 16G:
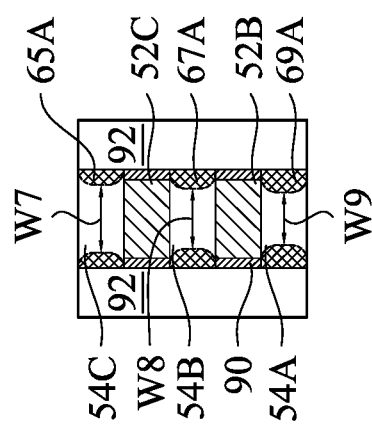

FIG. 16G illustrates the region 56 of FIG. 16D corresponding to the embodiment of FIG. 9E, after the formation of the epitaxial source/drain regions 92 in the first recesses 86. In an embodiment, the distance D1 of the region 65A is greater than the distance D5 of the region 69A, and the distance D1 of the region 65A is less than the distance D3 of the region 67A. As a result, the seventh width W7 is less than the ninth width W9, and the eighth width W8 is less than the seventh width W7. In an embodiment, the distance D1 of the region 65A is less than the distance D5 of the region 69A, and the distance D5 of the region 69A is less than the distance D3 of the region 67A. As a result, the seventh width W7 is greater than the ninth width W9, and the ninth width W9 is greater than the eighth width W8.

Figure 16H:
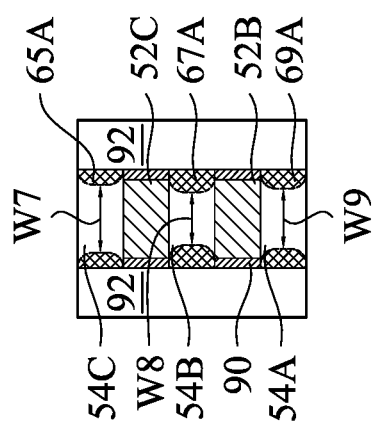

FIG. 16H illustrates the region 56 of FIG. 16D corresponding to the embodiment of FIG. 9F, after the formation of the epitaxial source/drain regions 92 in the first recesses 86. In an embodiment, the distance D1 of the region 65A is equal to the distance D3 of the region 67A, and the distance D3 of the region 67A is equal to the distance D5 of the region 69A. As a result, the seventh width W7, the eighth width W8 and the ninth width W9 are equal.

Figure 16I:
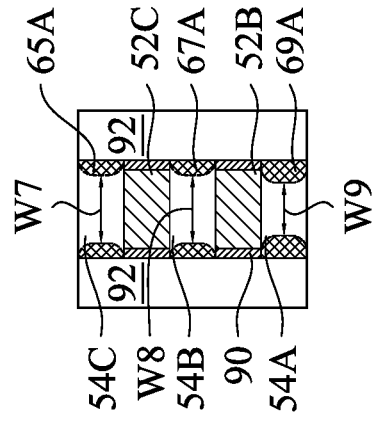

FIG. 16I illustrates the region 56 of FIG. 16D corresponding to the embodiment of FIG. 9G, after the formation of the epitaxial source/drain regions 92 in the first recesses 86. In an embodiment, the distance D3 of the region 67A is less than the distance D1 of the region 65A, and the distance D1 of the region 65A is less than the distance D5 of the region 69A. As a result, the seventh width W7 is greater than the ninth width W9, and the seventh width W7 is less than the eighth width W8. In an embodiment, the distance D3 of the region 67A is less than the distance D5 of the region 69A, and the distance D5 of the region 69A is less than the distance D1 of the region 65A. As a result, the eighth width W8 is greater than the ninth width W9, and the ninth width W9 is greater than the seventh width W7.

Figure 16J:
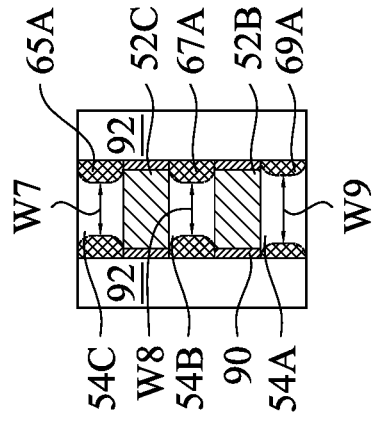

FIG. 16J illustrates the region 56 of FIG. 16D corresponding to the embodiment of FIG. 9H, after the formation of the epitaxial source/drain regions 92 in the first recesses 86. In an embodiment, the distance D1 of the region 65A is equal to the distance D3 of the region 67A, and the distance D3 of the region 67A and the distance D1 of the region 65A are less than the distance D5 of the region 69A. As a result, the seventh width W7 and the eighth width W8 are equal, and the seventh width W7 and the eighth width W8 are greater than the ninth width W9.

Figure 16K:
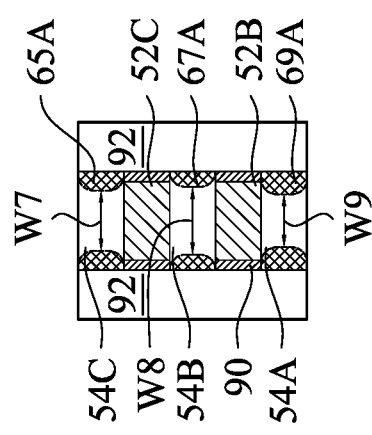

FIG. 16K illustrates the region 56 of FIG. 16D corresponding to the embodiment of FIG. 9I, after the formation of the epitaxial source/drain regions 92 in the first recesses 86. In an embodiment, the distance D3 of the region 67A is equal to the distance D5 of the region 69A, and the distance D3 of the region 67A and the distance D5 of the region 69A are less than the distance D1 of the region 65A. As a result, the eighth width W8 and the ninth width W9 are equal, and the eighth width W8 and the ninth width W9 are greater than the seventh width W7.

Figure 16L:
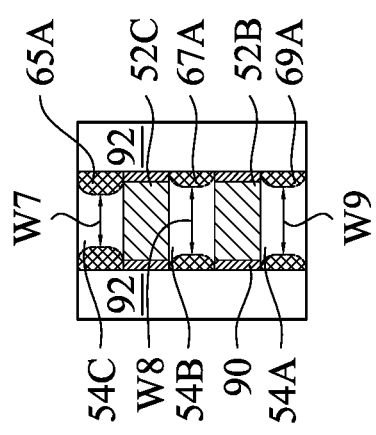

FIG. 16L illustrates the region 56 of FIG. 16D corresponding to the embodiment of FIG. 9J, after the formation of the epitaxial source/drain regions 92 in the first recesses 86. In an embodiment, the distance D1 of the region 65A is equal to the distance D3 of the region 67A, and the distance D1 of the region 65A and the distance D3 of the region 67A are greater than the distance D5 of the region 69A. As a result, the seventh width W7 and the eighth width W8 are equal, and the seventh width W7 and the eighth width W8 are less than the ninth width W9.

Figure 16M:
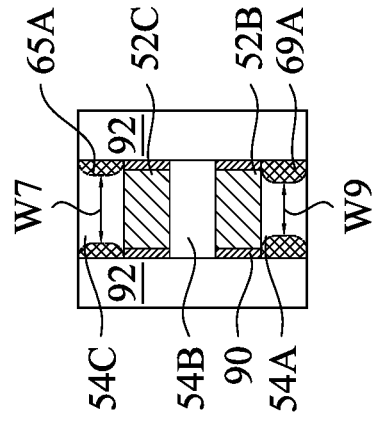

FIG. 16M illustrates the region 56 of FIG. 16D corresponding to the embodiment of FIG. 9K, after the formation of the epitaxial source/drain regions 92 in the first recesses 86. In an embodiment, the distance D1 of the region 65A is less than the distance D3 of the region 67A and the distance D5 of the region 69A, and the distance D3 of the region 67A and the distance D5 of the region 69A are equal. As a result, the eighth width W8 and the ninth width W9 are equal, and the seventh width W7 is greater than the eighth width W8 and the ninth width W9.

Figure 16N:
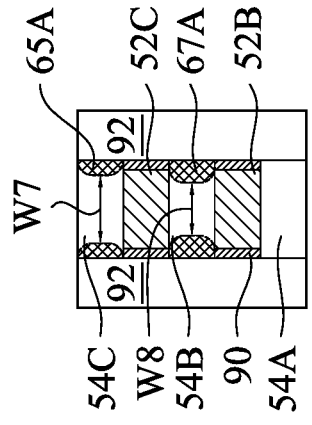

FIG. 16N illustrates the region 56 of FIG. 16D corresponding to the embodiment of FIG. 9L, after the formation of the epitaxial source/drain regions 92 in the first recesses 86. In an embodiment, the distance D1 of the region 65A is less than the distance D5 of the region 69A. As a result, the seventh width W7 is greater than the ninth width W9.

Figure 16O:
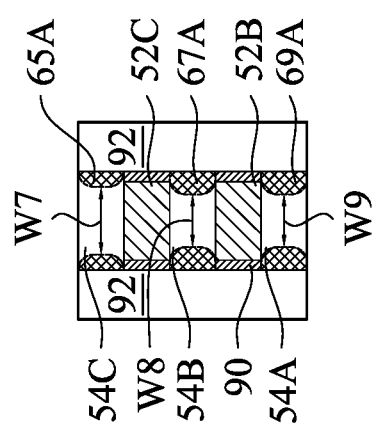

FIG. 16O illustrates the region 56 of FIG. 16D corresponding to the embodiment of FIG. 9M, after the formation of the epitaxial source/drain regions 92 in the first recesses 86. In an embodiment, the distance D1 of the region 65A is greater than the distance D5 of the region 69A. As a result, the seventh width W7 is less than the ninth width W9.

Figure 16P:
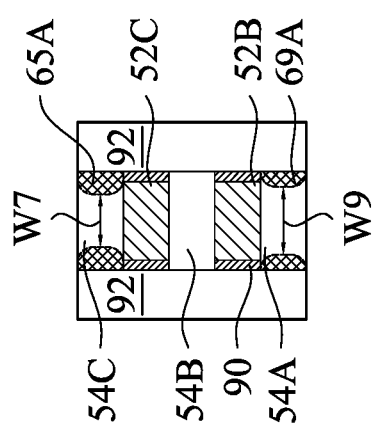

FIG. 16P illustrates the region 56 of FIG. 16D corresponding to the embodiment of FIG. 9N, after the formation of the epitaxial source/drain regions 92 in the first recesses 86. In an embodiment, the distance D1 of the region 65A is less than the distance D3 of the region 67A. As a result, the seventh width W7 is greater than the eighth width W8.

Figure 16Q:
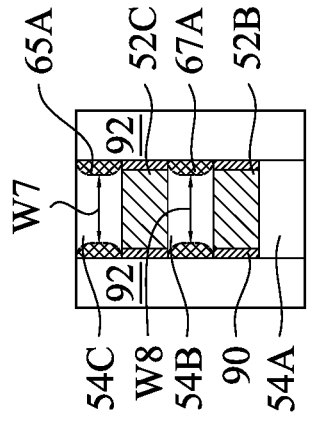

FIG. 16Q illustrates the region 56 of FIG. 16D corresponding to the embodiment of FIG. 9O, after the formation of the epitaxial source/drain regions 92 in the first recesses 86. In an embodiment, the distance D1 of the region 65A is greater than the distance D3 of the region 67A. As a result, the seventh width W7 is less than the eighth width W8.

Figure 16R:
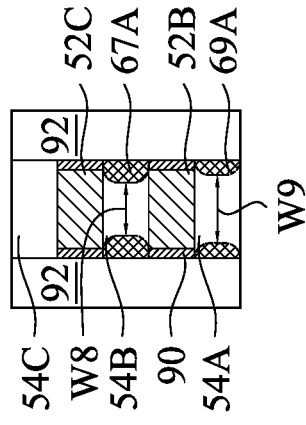

FIG. 16R illustrates the region 56 of FIG. 16D corresponding to the embodiment of FIG. 9P, after the formation of the epitaxial source/drain regions 92 in the first recesses 86. In an embodiment, the distance D1 of the region 65A is equal to the distance D3 of the region 67A. As a result, the seventh width W7 and the eighth width W8 are equal.

Figure 16S:
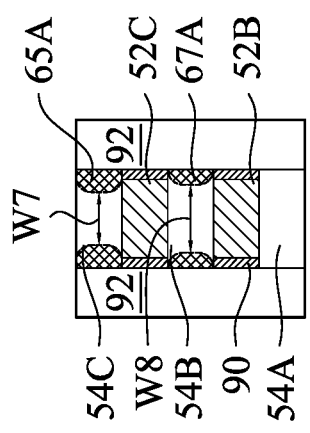

FIG. 16S illustrates the region 56 of FIG. 16D corresponding to the embodiment of FIG. 9Q, after the formation of the epitaxial source/drain regions 92 in the first recesses 86. In an embodiment, the distance D3 of the region 67A is less than the distance D5 of the region 69A. As a result, the eighth width W8 is greater than the ninth width W9.

Figure 16T:
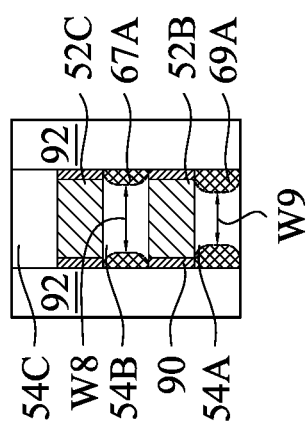
Figure 16V:
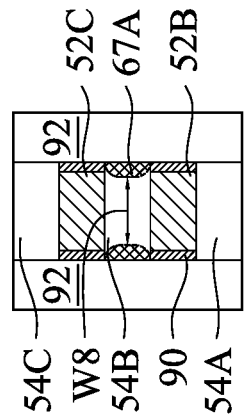

FIG. 16T illustrates the region 56 of FIG. 16D corresponding to the embodiment of FIG. 9R, after the formation of the epitaxial source/drain regions 92 in the first recesses 86. In an embodiment, the distance D3 of the region 67A is greater than the distance D5 of the region 69A. As a result, the eighth width W8 is less than the ninth width W9.

Figure 16U:
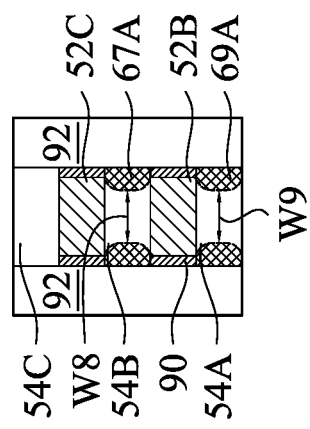

FIG. 16U illustrates the region 56 of FIG. 16D corresponding to the embodiment of FIG. 9S, after the formation of the epitaxial source/drain regions 92 in the first recesses 86. In an embodiment, the distance D3 of the region 67A is equal to the distance D5 of the region 69A As a result, the eighth width W8 is equal to the ninth width W9.

FIG. 16V illustrates the region 56 of FIG. 16D corresponding to the embodiment of FIG. 9T, after the formation of the epitaxial source/drain regions 92 in the first recesses 86. In an embodiment, a portion of the second nanostructure 54B (e.g., a portion of the channel region 60) in between the regions 67A, and under the spacers 83, the masks 78 and the dummy gates 76 has the eighth width W8. In other embodiments (not shown in the Figures), a portion of the second nanostructure 54C (e.g., a portion of the channel region 60) in between the regions 65A, and under the spacers 83, the masks 78 and the dummy gates 76 has the seventh width W7. In other embodiments (not shown in the Figures), a portion of the second nanostructure 54A (e.g., a portion of the channel region 60) in between the regions 69A, and under the spacers 83, the masks 78 and the dummy gates 76 has the ninth width W9.

Advantages can be achieved as a result of the different dopant and laterally straggled profiles of the alternate embodiments shown in FIGS. 16E through 16V. For example, the embodiments of FIGS. 16E, 16J, 16M, 16N, 16P and 16S may allow for a reduction in leakage current at the bottom of the epitaxial source/drain regions 92. The embodiments of FIGS. 16F, 16K, 16L, 16O, 16Q and 16T may be used for devices whose performance or operation is not hindered by drain-induced barrier lowering (DIBL) effects. The embodiments of FIGS. 16H, 16R, 16U and 16V may be used when equal current flow in two or more of the second nanostructures 54A-54C (which may also be subsequently referred to as channel layers 54A-54C) is desired. The embodiments of FIGS. 16G, 16T and 16V may be used to form different dopant profiles as desired when the etching process used to form the first recesses 86 (described in FIGS. 11A through 11C) does not form the first recesses 86 with completely vertical sidewalls.

Figure 17B:
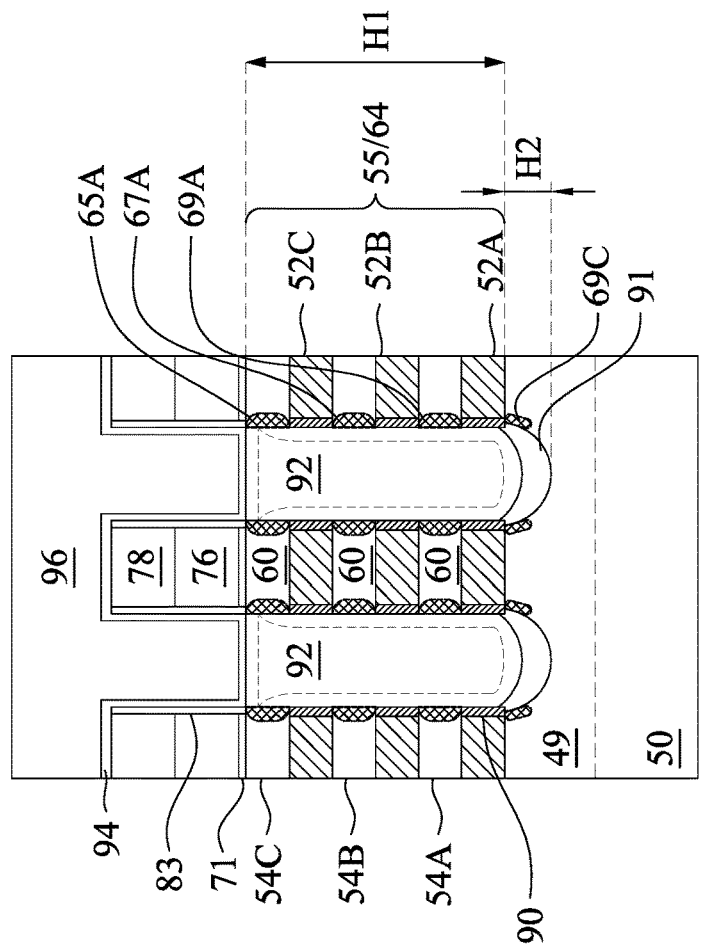
Figure 17A:
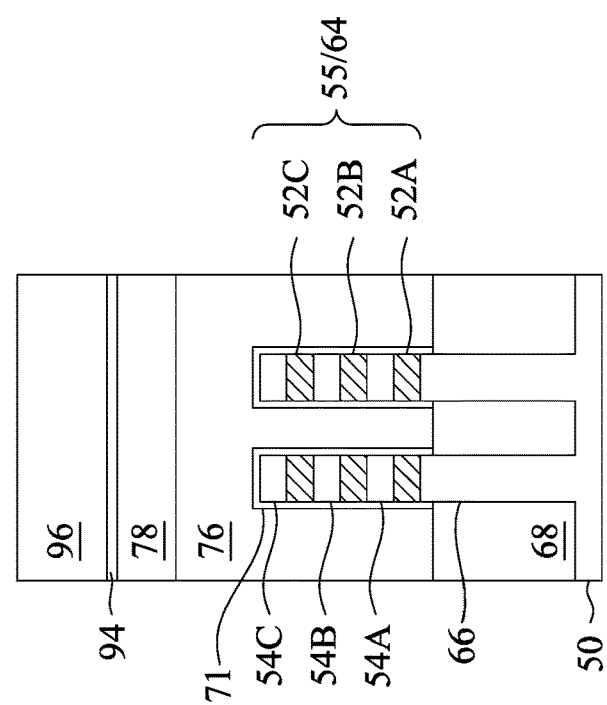

In FIGS. 17A and 17B, a first interlayer dielectric (ILD) 96 is deposited over the structure illustrated in FIGS. 16A through 16D. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the spacers 83. The CESL 94 may comprise a dielectric material, such as, silicon nitride, silicon oxide, silicon oxynitride, or the like, having a different etch rate than the material of the overlying first ILD 96.

Figure 18B:
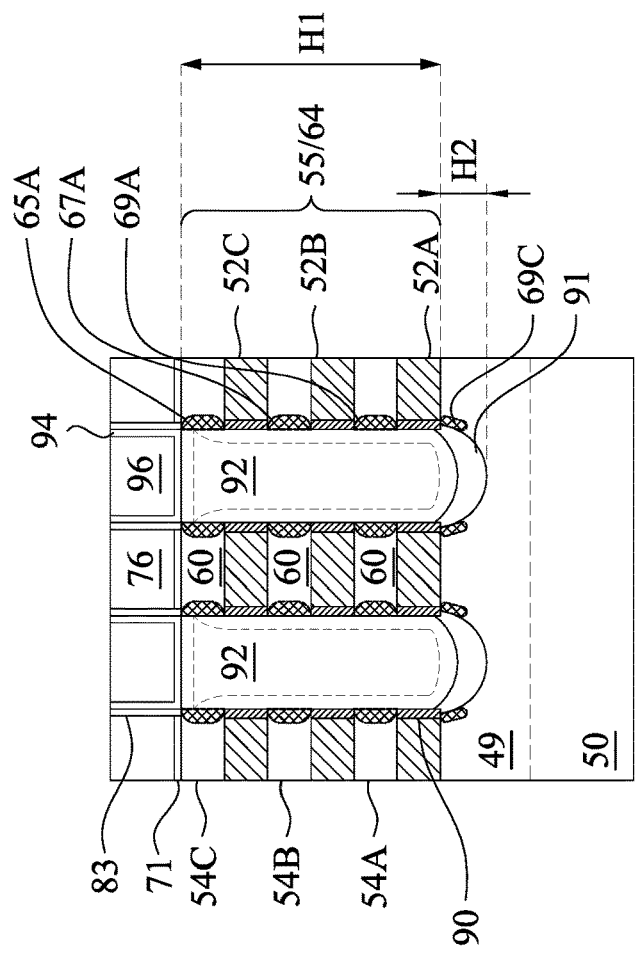
Figure 18A:
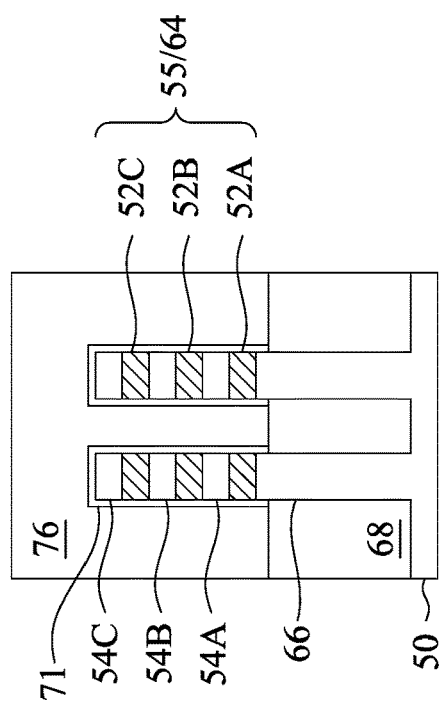

In FIGS. 18A and 18B, a planarization process, such as a CMP, may be performed to level the top surface of the first ILD 96 with the top surfaces of the dummy gates 76 or the masks 78. The planarization process may also remove the masks 78 on the dummy gates 76, and portions of the spacers 83 along sidewalls of the masks 78. After the planarization process, top surfaces of the dummy gates 76, the spacers 83, and the first ILD 96 are level. Accordingly, the top surfaces of the dummy gates 76 are exposed through the first ILD 96. In some embodiments, the masks 78 may remain, in which case the planarization process levels the top surface of the first ILD 96 with top surface of the masks 78, and the spacers 83.

Figures 19A, 19B:
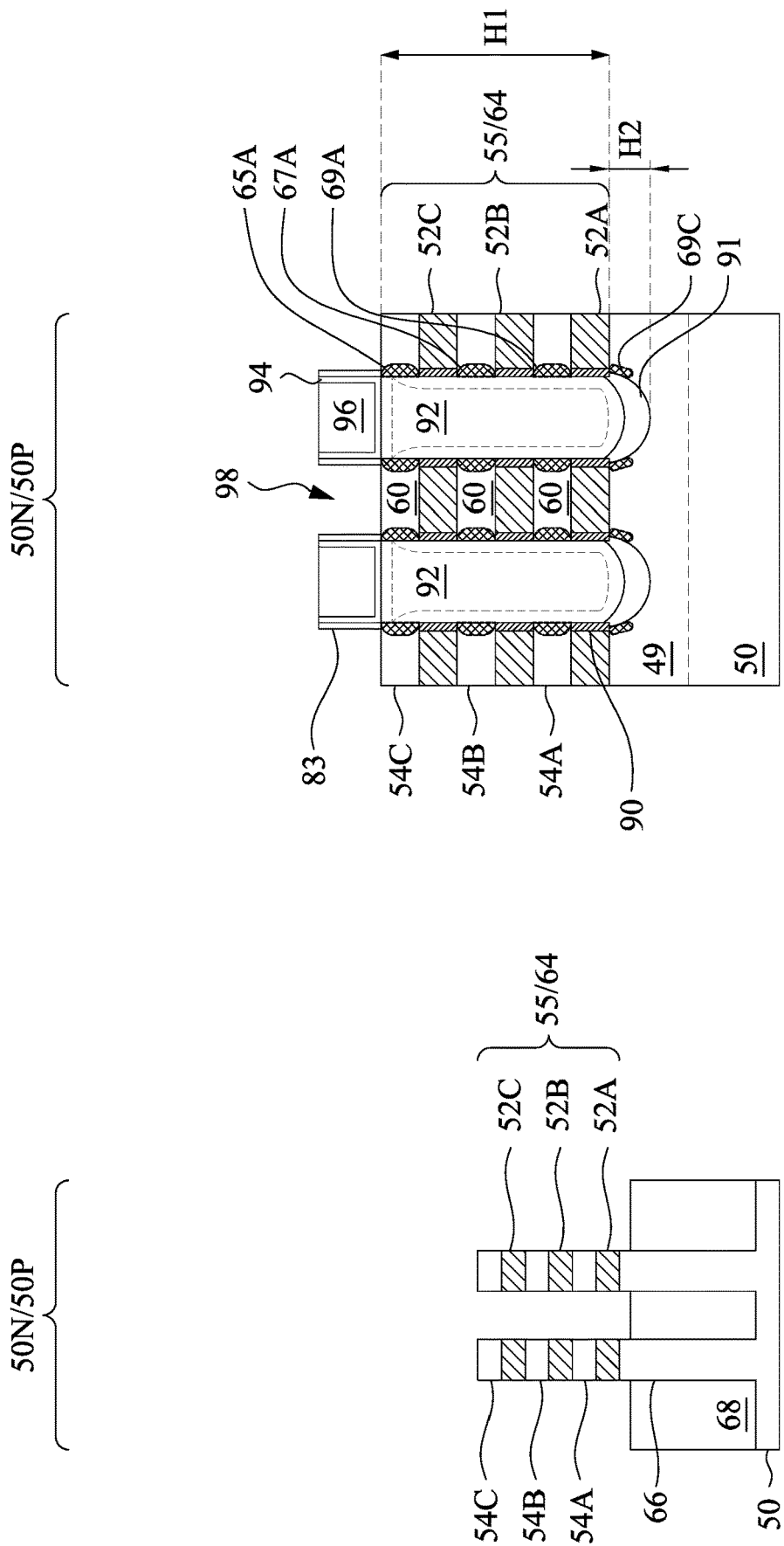

In FIGS. 19A and 19B, the dummy gates 76, and the masks 78 if present, are removed in an etching step(s), so that recesses 98 are formed. Portions of the dummy gate dielectrics 71 in the recesses 98 may also be removed. In some embodiments, only the dummy gates 76 are removed and the dummy gate dielectrics 71 remain and are exposed by the recesses 98. In some embodiments, the dummy gate dielectrics 71 are removed from recesses 98 in a first region of a die (e.g., a core logic region) and remains in recesses 98 in a second region of the die (e.g., an input/output region). In some embodiments, the dummy gates 76 are removed by an anisotropic dry etch process. For example, the etching process may include a dry etch process using reaction gas(es) that selectively etch the dummy gates 76 without etching the first ILD 96 and the spacers 83. Each recess 98 exposes and/or overlies the multi-layer stacks 64. Portions of the multi-layer stacks 64 are disposed between neighboring pairs of the epitaxial source/drain regions 92. During the removal, the dummy gate dielectrics 71 may be used as an etch stop layer when the dummy gates 76 are etched. The dummy gate dielectrics 71 may then be optionally removed after the removal of the dummy gates 76.

Figure 20B:
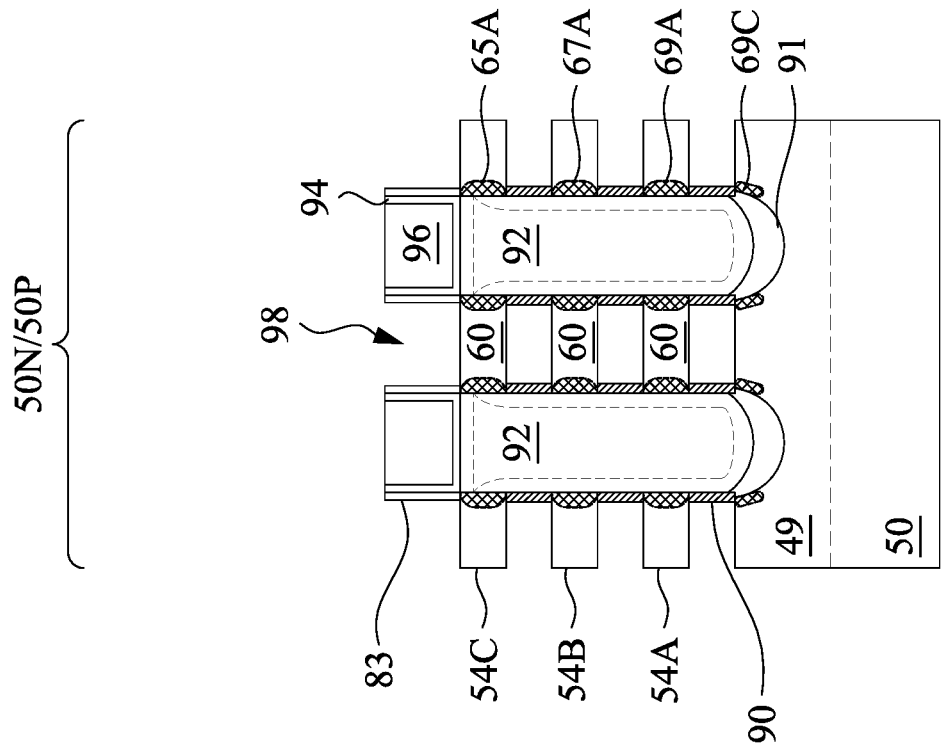
Figure 20A:
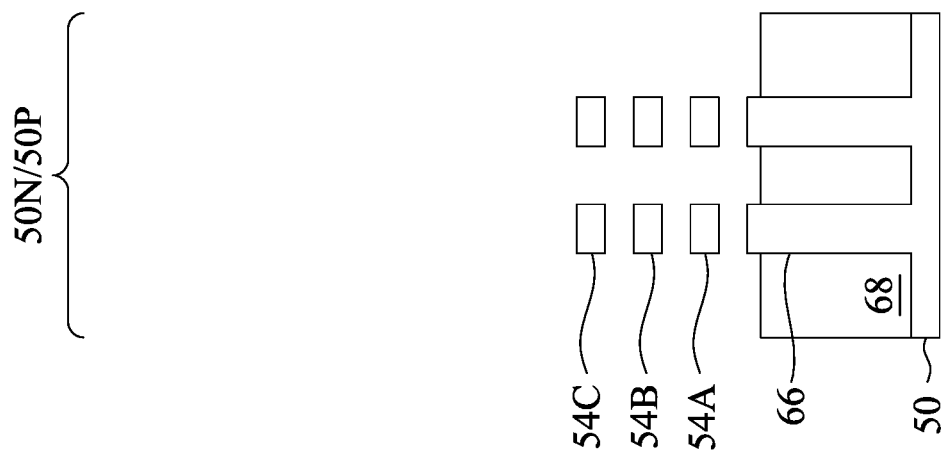

In FIGS. 20A and 20B, the first nanostructures 52A, 52B and 52C are removed from the regions 50N and the region 50P. The first nanostructures 52A, 52B and 52C may be removed by isotropic etching processes such as wet etching, dry etching, or the like. The etchants used to remove the first nanostructures 52A, 52B and 52C may be selective to the materials of the second nanostructures 54A, 54B and 54C. The second nanostructures 54A, 54B and 54C may also be subsequently referred to as channel layers 54A, 54B and 54C, respectively. In an embodiment in which first nanostructures 52A, 52B and 52C comprise the first semiconductor material (e.g., SiGe, or the like) and the second nanostructures 54A, 54B and 54C comprise the second semiconductor material (e.g., Si, SiC, or the like), a fluorine-based etchant, such as hydrogen fluoride (HF) or the like may be used remove layers of the multi-layer stack 64 in the regions 50N and region 50P.

Figures 21A, 21B:
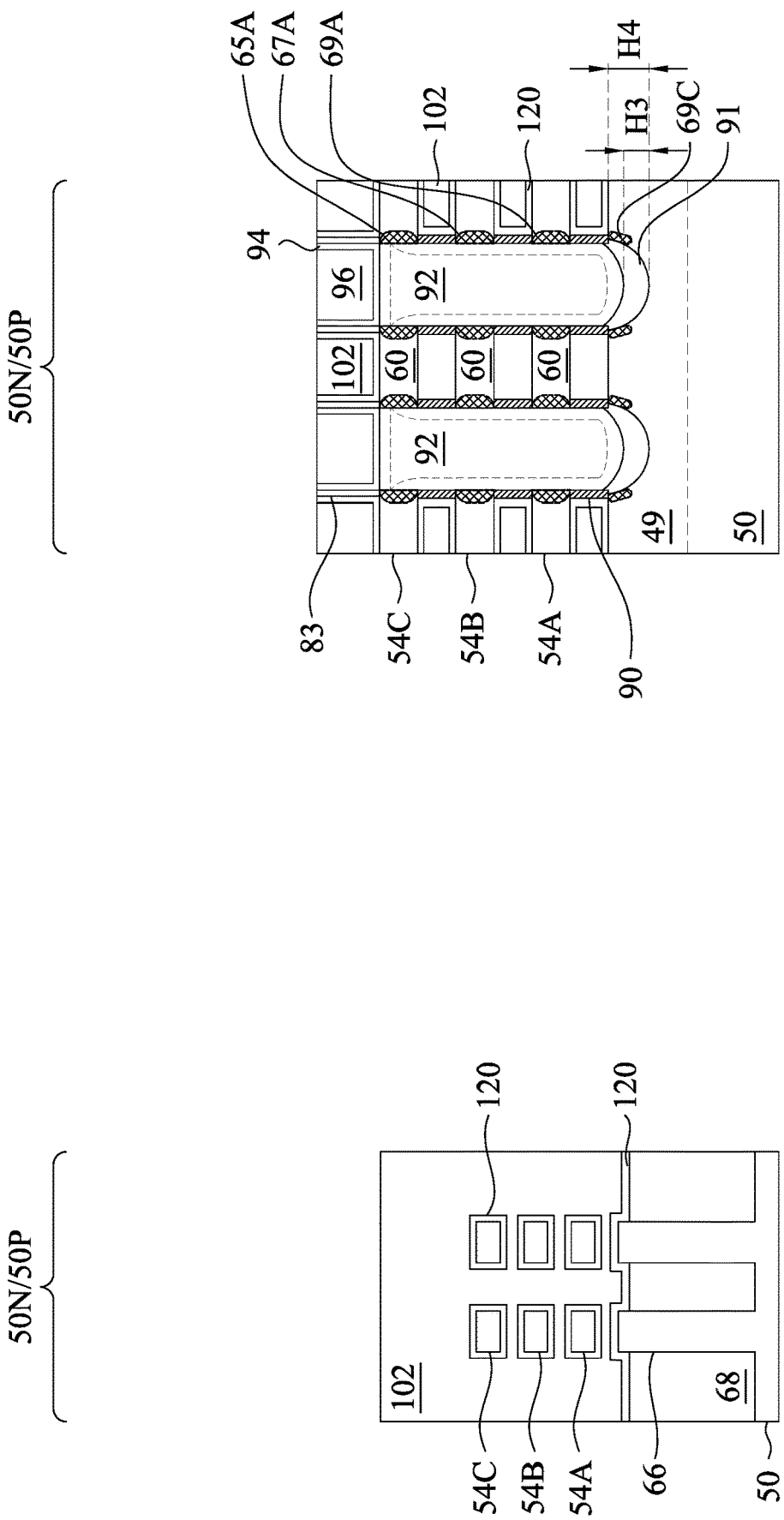

In FIGS. 21A and 21B, gate dielectric layers 120 and gate electrodes 102 are formed for replacement gates. The gate dielectric layers 120 are deposited conformally in the recesses 98. The gate dielectric layers 120 may be formed on top surfaces, sidewalls, and bottom surfaces of the second nanostructures 54A, 54B and 54C. The gate dielectric layers 120 may also be deposited on top surfaces of the first ILD 96, the CESL 94, the spacers 83, and the STI regions 68 and on sidewalls of the spacers 83 and the inner spacers 90.

In accordance with some embodiments, the gate dielectric layers 120 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 120 include a high-k dielectric material, and in these embodiments, the gate dielectric layers 120 may have a k-value greater than about 7.0, and may include a metal oxide or a silicate of hafnium, aluminum, zirconium, lanthanum, manganese, barium, titanium, lead, and combinations thereof. The structure of the gate dielectric layers 120 may be the same or different in the n-type region 50N and the p-type region 50P. The formation methods of the gate dielectric layers 120 may include molecular-beam deposition (MBD), ALD, PECVD, and the like.

The gate electrodes 102 are deposited over the gate dielectric layers 120, respectively, and fill the remaining portions of the recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 21A and 21B, the gate electrodes 102 may comprise any number of liner layers, any number of work function tuning layers, and a fill material. Any combination of the layers which make up the gate electrodes 102 may be deposited between adjacent ones of the second nanostructures 54.

The formation of the gate dielectric layers 120 in the n-type region 50N and the p-type region 50P may occur simultaneously such that the gate dielectric layers 120 in each region are formed from the same materials, and the formation of the gate electrodes 102 may occur simultaneously such that the gate electrodes 102 in each region are formed from the same materials. In some embodiments, the gate dielectric layers 120 in each region may be formed by distinct processes, such that the gate dielectric layers 120 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the recesses 98, a planarization process, such as a CMP, may be performed to remove the excess portions of the gate dielectric layers 120 and the material of the gate electrodes 102, which excess portions are over the top surface of the first ILD 96. The remaining portions of material of the gate electrodes 102 and the gate dielectric layers 120 thus form replacement gate structures of the resulting nano-FETs. The gate electrodes 102 and the gate dielectric layers 120 may be collectively referred to as "gate structures."

In an embodiment, a fourth height H4 from a bottommost surface of the gate structures (e.g., the gate dielectric layers 120 and the gate electrodes 102) to a bottommost point of the first epitaxial material 91 may be in a range from 15 nm to 30 nm. As shown in FIG. 21B, in an embodiment, a bottommost point of a top surface of the first epitaxial material 91 is lower than the bottommost surface of the gate structures (e.g., the gate dielectric layers 120 and the gate electrodes 102).

Figure 22B:
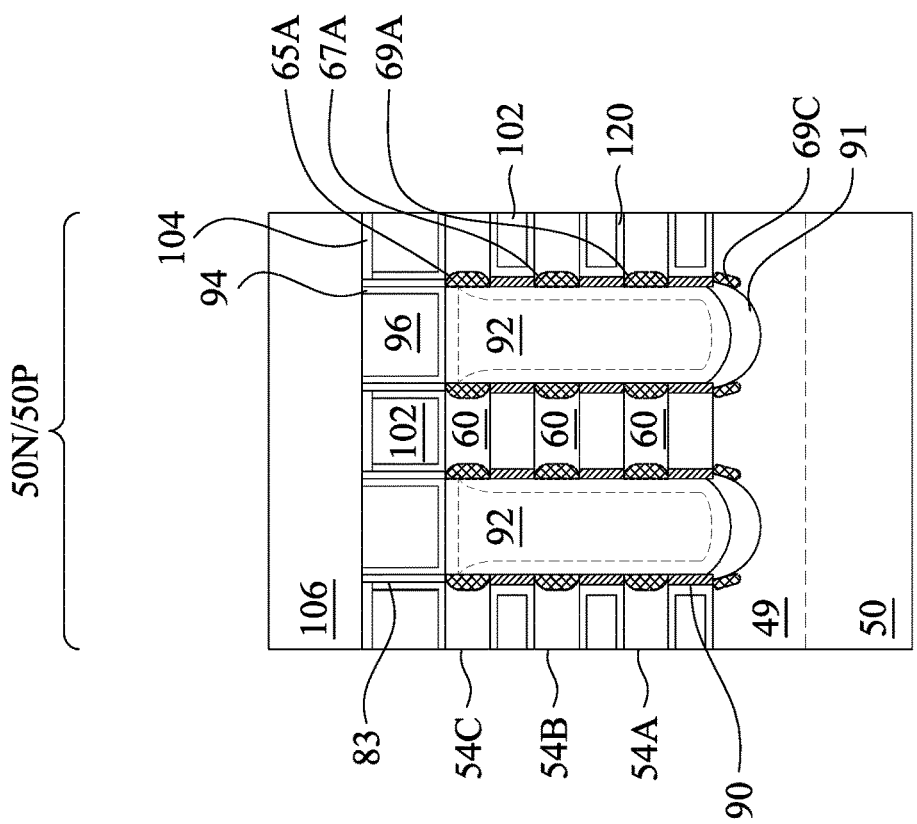
Figure 22A:
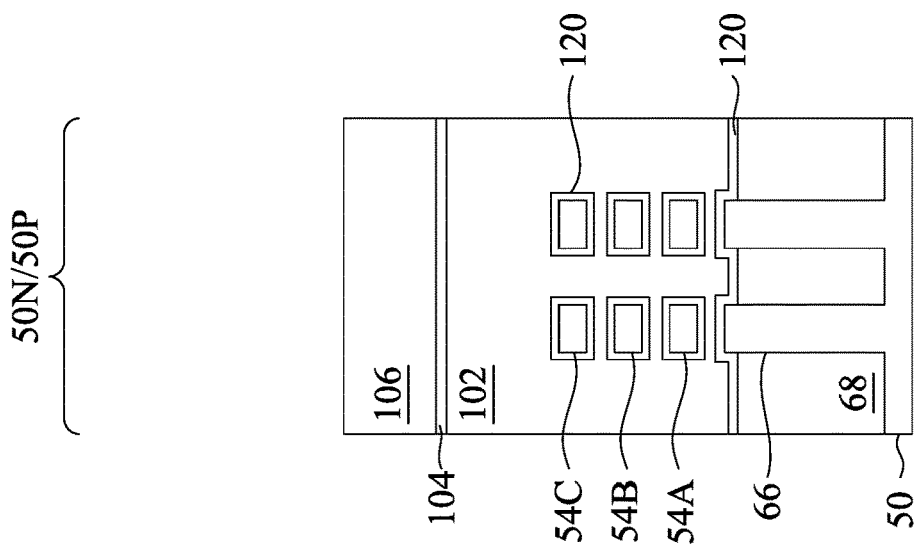

In FIGS. 22A and 22B, the gate structures (including the gate dielectric layers 120 and the corresponding overlying gate electrodes 102) are recessed, so that recess are formed directly over the gate structures and between opposing portions of the spacers 83. Gate masks 104 comprising one or more layers of dielectric material, such as silicon nitride, silicon oxynitride, or the like, are filled in the recesses, followed by a planarization process to remove excess portions of the dielectric material extending over the first ILD 96. Subsequently formed gate contacts (such as the gate contacts 114, discussed below with respect to FIGS. 24A and 24B) penetrate through the gate masks 104 to contact the top surfaces of the recessed gate electrodes 102.

As further illustrated by FIGS. 22A and 22B, a second ILD 106 is deposited over the first ILD 96 and over the gate masks 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 23B:
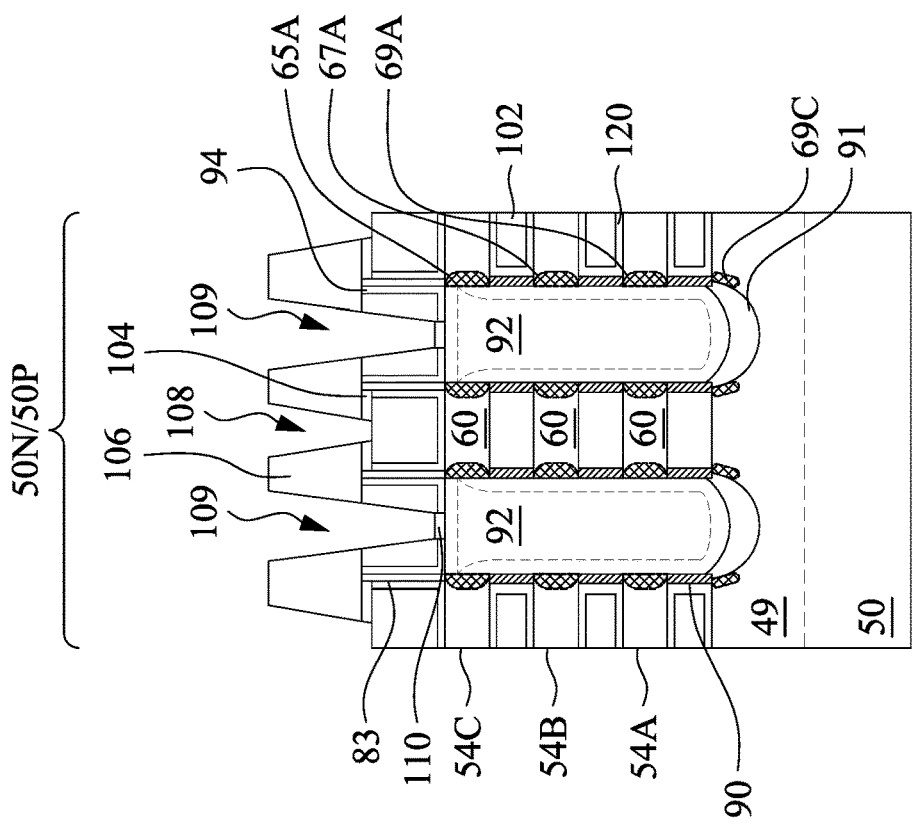
Figure 23A:
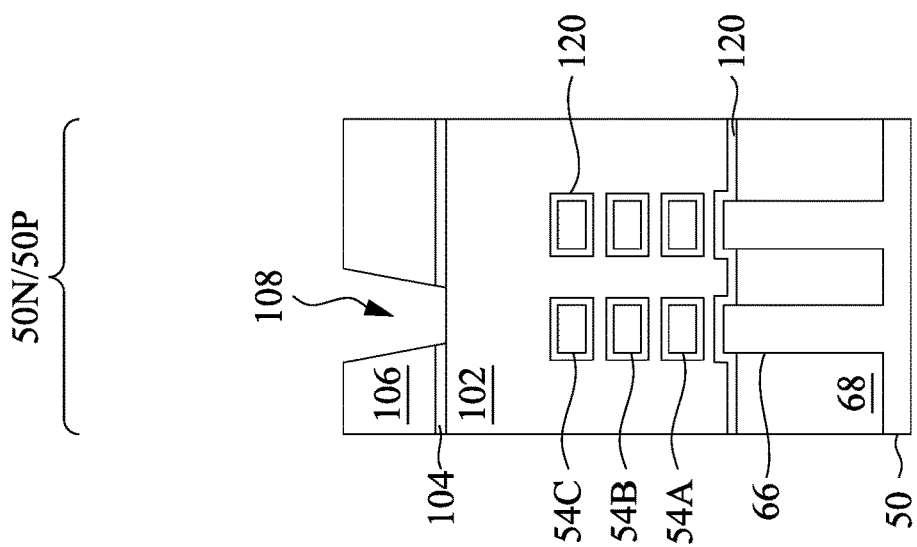

In FIGS. 23A and 23B, openings 108 for gate contacts 114 (shown subsequently in FIGS. 24A and 24B) are formed through the second ILD 106 and the gate mask 104, and openings 109 for source/drain contacts 112 (shown subsequently in FIG. 24B) are formed through the second ILD 106 and the first ILD 96. The openings 108 and 109 may be formed using acceptable photolithography and etching techniques. The openings 108 may expose surfaces of the gate structures and the openings 109 may expose surfaces of the epitaxial source/drain regions 92. Silicide regions 110 are formed over the epitaxial source/drain regions 92 by first depositing a metal (not separately illustrated) capable of reacting with the semiconductor materials of the underlying epitaxial source/drain regions 92 (e.g. silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, and then performing a thermal anneal process to form the silicide regions 110. The un-reacted portions of the deposited metal are then removed, e.g., by an etching process.

Figure 24B:
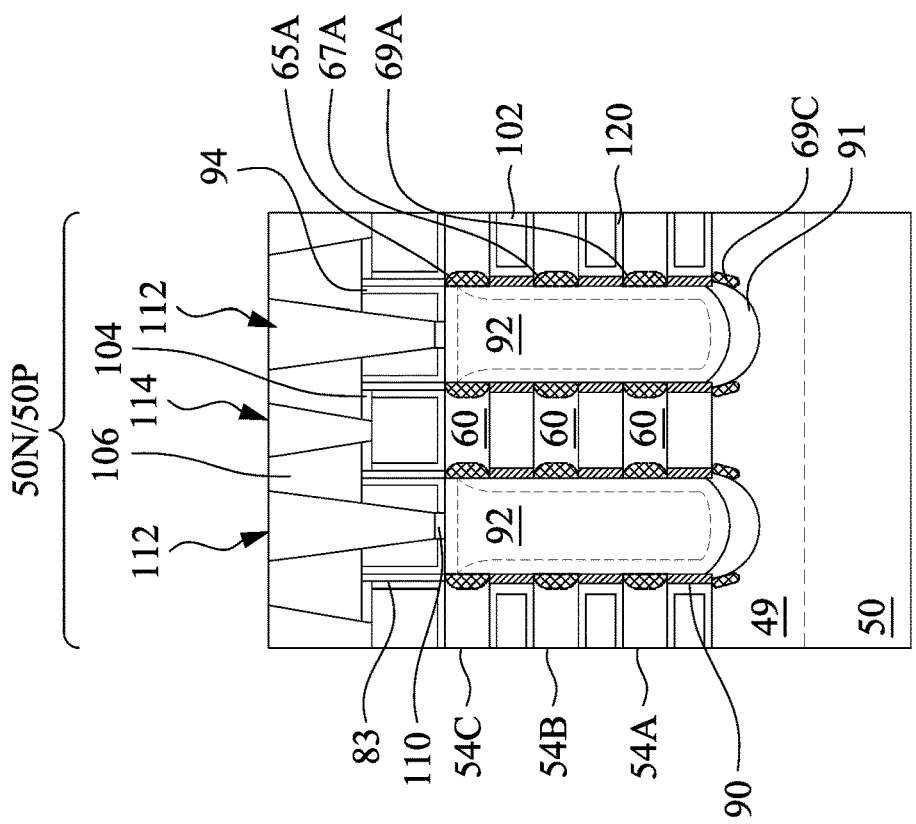
Figure 24A:
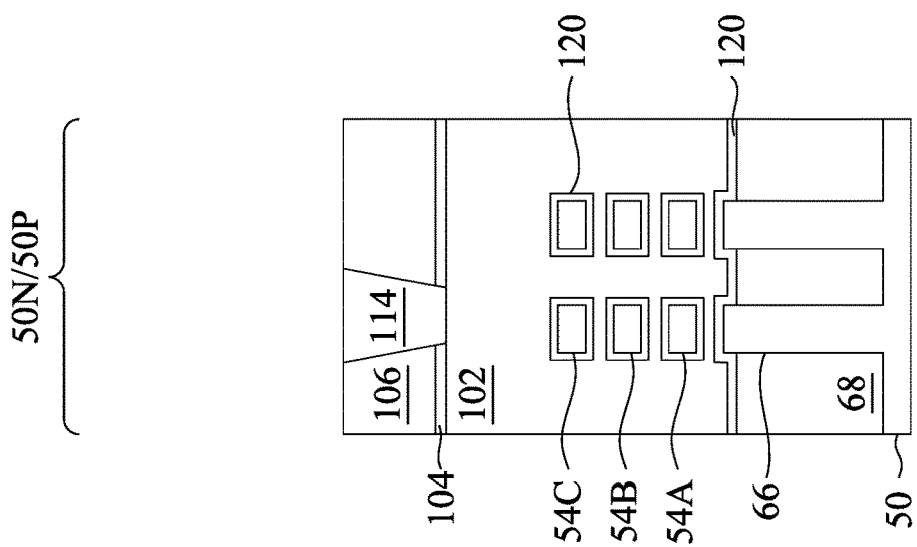

In FIGS. 24A and 24B, a liner, such as a diffusion barrier layer, an adhesion layer, or the like, and a conductive material are formed in the openings 108 and 109. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106. The remaining liner and conductive material form gate contacts 114 in the openings 108, and form source/drain contacts 112 in the openings 109. The gate contacts 114 are physically and electrically coupled to the gate electrodes 102, and the source/drain contacts 112 are physically and electrically coupled to the epitaxial source/drain regions 92.

The embodiments of the present disclosure have some advantageous features. The embodiments include forming semiconductor nanostructures over a semiconductor fin, and forming a dummy gate and a mask over the semiconductor nanostructures and the fin. First spacers are then formed on sidewalls of the dummy gate and the mask. A plurality of ion implantation processes are then performed on the semiconductor nanostructures using modulated ion beams with different implant energies and doses. Second spacers are then formed along sidewalls of the first spacers. A recess is formed in the semiconductor nanostructures and the semiconductor fin. Subsequently, an undoped silicon layer is formed in the recess and an ion implantation process is performed on the silicon layer such that the silicon layer has a gradient-doped profile. A source/drain region is then formed in the recess over the gradient-doped silicon layer. One or more embodiments disclosed herein may allow for the ability to control the lateral straggle of dopants at different depths into the channel regions of the semiconductor structures, as well as allowing for increased lateral straggle into the channel regions under the first spacers, the second spacers and the dummy gate. This allows for the straggled dopants to extend further into the channel regions of the semiconductor structures and results in shortened effective channel lengths and therefore reduced channel resistance ($R_{ch}$). In addition, the formation of the silicon layer with the gradient-doped profile under the source/drain region results in a reduced electric field under the source/drain region and consequently results in lower junction leakage current ($I_{boff}$). Further, the disclosed method may be integrated easily into existing processes and provides a solution to junction leakage current and channel resistance with lower manufacturing costs.

In accordance with an embodiment, a method includes depositing a multi-layer stack on a semiconductor substrate, the multi-layer stack including a plurality of sacrificial layers that alternate with a plurality of channel layers; forming a dummy gate on the multi-layer stack; forming a first spacer on a sidewall of the dummy gate; performing a first implantation process to form a first doped region, the first implantation process having a first implant energy and a first implant dose; performing a second implantation process to form a second doped region, where the first doped region and the second doped region are in a portion of the channel layers uncovered by the first spacer and the dummy gate, the second implantation process having a second implant energy and a second implant dose, where the second implant energy is greater than the first implant energy, and where the first implant dose is different from the second implant dose; after performing the first implantation process and the second implantation process, forming a second spacer on a sidewall of the first spacer; forming a first recess in the multi-layer stack adjacent the second spacer; and forming an epitaxial source/drain region in the first recess. In an embodiment, performing the first implantation process and the second implantation process includes implanting arsenic (As), phosphorous (P), antimony (Sb), boron difluoride ($BF_2$), or boron (B) into exposed portions of the multi-layer stack. In an embodiment, the first spacer and the second spacer have a thickness that is in a range from 3 nm to 5 nm. In an embodiment, dopant concentrations of the first doped region and the second doped region are in a range from $1\times10^{17}$ atoms/cm$^3$ to $1\times10^{21}$ atoms/cm$^3$. In an embodiment, a dopant concentration of the epitaxial source/drain region is greater than dopant concentrations of the first doped region and the second doped region. In an embodiment, after the first implantation process and the second implantation process, dopants from the first doped region migrate in a direction parallel to a top surface of the semiconductor substrate into a first portion of a first channel layer beneath the dummy gate, and dopants from the second doped region move in a direction parallel to the top surface of the semiconductor substrate into a second portion of a second channel layer beneath the dummy gate, where the second channel layer is below the first channel layer. In an embodiment, the first implant dose is greater than the second implant dose, and where a first width of the first portion of the first channel layer is greater than a second width of the second portion of the second channel layer. In an embodiment, the first implant dose is less than the second implant dose, and where a first width of the first portion of the first channel layer is less than a second width of the second portion of the second channel layer.

In accordance with an embodiment, a method includes forming a dummy gate on a first channel region of a first channel layer and a second channel region of a second channel layer, the first channel layer and the second channel layer disposed above a semiconductor substrate; forming a first spacer on a sidewall of the dummy gate; performing a first implantation process to implant dopants in the first channel layer to form first doped portions on first ends of the first channel region; performing a second implantation process to implant dopants in the second channel layer to form second doped portions on second ends of the second channel region, where during the first implantation process and the second implantation process the dummy gate and the first spacers are used as an implant mask, where each of the first doped portions and the second doped portions have a gradient-doped profile; and after performing the first implantation process and the second implantation process, forming a second spacer on a sidewall of the first spacer. In an embodiment, dopant concentrations of the first doped portions and the second doped portions are in a range from $1\times10^{18}$ atoms/cm$^3$ to $1\times10^{20}$ atoms/cm$^3$. In an embodiment, the first implantation process forms third doped portions in the first channel layer, each third doped portion being adjacent to a corresponding first doped portion, and where the second implantation process forms fourth doped portions in the second channel layer, each fourth doped portion being adjacent to a corresponding second doped portion, wherein dopant concentrations of the third doped portions and the fourth doped portions are greater than dopant concentrations of the first doped portions and the second doped portions. In an embodiment, a dopant concentration of each respective first doped portion decreases in a direction extending away from a center of the respective first doped portion to the first channel region, and where a dopant concentration of each respective second doped portion decreases in a direction extending away from a center of the respective second doped portion to the second channel region. In an embodiment, the first implantation process is performed with a first implant energy and a first implant dose, and the second implantation process is performed with a second implant energy and a second implant dose, where the second implant energy is greater than the first implant energy, and where the first implant dose is different from the second implant dose. In an embodiment, the second implant dose is greater than the first implant dose, and a first width of each of the first doped portions is less than a second width of each of the second doped portions. In an embodiment, the second implant dose is less than the first implant dose, and a first width of each of the first doped portions is greater than a second width of each of the second doped portions.

In accordance with an embodiment, a semiconductor device includes a first channel layer over a semiconductor substrate; a second channel layer over the first channel layer; a gate structure wrapping around the first channel layer and the second channel layer; source/drain regions at opposing sides of the gate structure, the first channel layer, and the second channel layer; first doped portions at ends of the first channel layer, each of the first doped portions being in physical contact with an adjacent source/drain region, where a dopant concentration of each of the first doped portions decreases in a direction extending away from the adjacent source/drain region; and second doped portions at ends of the second channel layer, each of the second doped portions being in physical contact with an adjacent source/drain region, where a dopant concentration of each of the second doped portions decreases in a direction extending away from the adjacent source/drain region, where the dopant concentration of the first doped portions and the second doped portion are lower than dopant concentrations of the source/drain regions. In an embodiment, the dopant concentrations of the source/drain regions are in a range of 2 to 3 orders of magnitude greater than the dopant concentrations of the first doped portions and the second doped portions. In an embodiment, a first width of the first channel layer between the first doped portions is different from a second width of the second channel layer between the second doped portions. In an embodiment, the semiconductor device further includes a third channel layer over the second channel layer, where the source/drain regions are also at opposing sides of the third channel layer; and third doped portions at ends of the third channel layer, each of the third doped portions being in physical contact with an adjacent source/drain region, where the first width and the second width are different from a third width of the third channel layer between the third doped portions. In an embodiment, the first width is less than the second width, and where the second width is less than the third width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a multi-layer stack on a semiconductor substrate, the multi-layer stack comprising a plurality of sacrificial layers that alternate with a plurality of channel layers;
   forming a dummy gate on the multi-layer stack;
   forming a first spacer on a sidewall of the dummy gate;
   performing a first implantation process to form a first doped region, the first implantation process having a first implant energy and a first implant dose;
   performing a second implantation process to form a second doped region, wherein the first doped region and the second doped region are in a portion of the channel layers uncovered by the first spacer and the dummy gate, the second implantation process having a second implant energy and a second implant dose, wherein the second implant energy is greater than the first implant energy, and wherein the first implant dose is different from the second implant dose;
   after performing the first implantation process and the second implantation process, forming a second spacer on a sidewall of the first spacer;
   forming a first recess in the multi-layer stack adjacent the second spacer; and
   forming an epitaxial source/drain region in the first recess.

2. The method of claim 1, wherein performing the first implantation process and the second implantation process comprises implanting arsenic (As), phosphorous (P), antimony (Sb), boron di-fluoride (BF$_2$), or boron (B) into exposed portions of the multi-layer stack.

3. The method of claim 1, wherein the first spacer and the second spacer have a thickness that is in a range from 3 nm to 5 nm.

4. The method of claim 1, wherein dopant concentrations of the first doped region and the second doped region are in a range from 1×1017 atoms/cm3 to 1×1021 atoms/cm3.

5. The method of claim 4, wherein a dopant concentration of the epitaxial source/drain region is greater than dopant concentrations of the first doped region and the second doped region.

6. The method of claim 1, wherein after the first implantation process and the second implantation process, dopants from the first doped region migrate in a direction parallel to a top surface of the semiconductor substrate into a first portion of a first channel layer beneath the dummy gate, and dopants from the second doped region move in a direction parallel to the top surface of the semiconductor substrate into a second portion of a second channel layer beneath the dummy gate, wherein the second channel layer is below the first channel layer.

7. The method of claim 6, wherein the first implant dose is greater than the second implant dose, and wherein a first width of the first portion of the first channel layer is greater than a second width of the second portion of the second channel layer.

8. The method of claim 6, wherein the first implant dose is less than the second implant dose, and wherein a first width of the first portion of the first channel layer is less than a second width of the second portion of the second channel layer.

9. A method comprising:
forming a dummy gate on a first channel region of a first channel layer and a second channel region of a second channel layer, the first channel layer and the second channel layer disposed above a semiconductor substrate;
forming a first spacer on a sidewall of the dummy gate;
performing a first implantation process to implant dopants in the first channel layer to form first doped portions on first ends of the first channel region;
performing a second implantation process to implant dopants in the second channel layer to form second doped portions on second ends of the second channel region, wherein during the first implantation process and the second implantation process the dummy gate and the first spacers are used as an implant mask, wherein each of the first doped portions and the second doped portions have a gradient-doped profile; and
after performing the first implantation process and the second implantation process, forming a second spacer on a sidewall of the first spacer.

10. The method of claim 9, wherein dopant concentrations of the first doped portions and the second doped portions are in a range from 1×1018 atoms/cm3 to 1×1020 atoms/cm3.

11. The method of claim 9, wherein the first implantation process forms third doped portions in the first channel layer, each third doped portion being adjacent to a corresponding first doped portion, and wherein the second implantation process forms fourth doped portions in the second channel layer, each fourth doped portion being adjacent to a corresponding second doped portion, wherein dopant concentrations of the third doped portions and the fourth doped portions are greater than dopant concentrations of the first doped portions and the second doped portions.

12. The method of claim 11, wherein a dopant concentration of each respective first doped portion decreases in a direction extending away from a center of the respective first doped portion to the first channel region, and wherein a dopant concentration of each respective second doped portion decreases in a direction extending away from a center of the respective second doped portion to the second channel region.

13. The method of claim 9, wherein the first implantation process is performed with a first implant energy and a first implant dose, and the second implantation process is performed with a second implant energy and a second implant dose, wherein the second implant energy is greater than the first implant energy, and wherein the first implant dose is different from the second implant dose.

14. The method of claim 13, wherein the second implant dose is greater than the first implant dose, and a first width of each of the first doped portions is less than a second width of each of the second doped portions.

15. The method of claim 13, wherein the second implant dose is less than the first implant dose, and a first width of each of the first doped portions is greater than a second width of each of the second doped portions.

16. A method comprising:
forming a dummy gate on a multi-layer stack, the multi-layer stack comprising a plurality of sacrificial layers that alternate with a plurality of channel layers;
forming a first spacer on a sidewall of the dummy gate;
performing a first implantation process to form first doped portions on first ends of a first channel region of a first channel layer of the plurality of channel layers;
performing a second implantation process to form second doped portions on second ends of a second channel region of a second channel layer of the plurality of channel layers;
forming a first recess in the multi-layer stack adjacent the dummy gate;
forming a semiconductor material in a bottom portion of the first recess;
performing a third implantation process to introduce dopants into the semiconductor material; and
forming an epitaxial source/drain region over the semiconductor material in the first recess.

17. The method of claim 16, wherein forming the semiconductor material in the bottom portion of the first recess comprises depositing undoped silicon in the bottom portion of the first recess.

18. The method of claim 17, wherein after performing the third implantation process, a dopant concentration in the semiconductor material is in a range from 1×1020 atoms/cm3 to 1×1019 atoms/cm3.

19. The method of claim 17, wherein after performing the third implantation process, the semiconductor material has a gradient-doped profile.

20. The method of claim 16, wherein performing the first implantation process and the second implantation process comprises implanting arsenic (As), phosphorous (P), antimony (Sb), boron di-fluoride (BF$_2$), or boron (B) into exposed portions of the multi-layer stack.

* * * * *